(12) United States Patent
Tai et al.

(10) Patent No.: US 11,637,055 B2
(45) Date of Patent: Apr. 25, 2023

(54) SEMICONDUCTOR DEVICE PACKAGE

(71) Applicant: Advanced Semiconductor Engineering, Inc., Kaohsiung (TW)

(72) Inventors: Li-Hua Tai, Kaohsiung (TW); Wen-Pin Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 102 days.

(21) Appl. No.: 16/984,120

(22) Filed: Aug. 3, 2020

(65) Prior Publication Data
US 2022/0037244 A1 Feb. 3, 2022

(51) Int. Cl.
*H01L 23/498* (2006.01)
*H01L 25/18* (2006.01)
(Continued)

(52) U.S. Cl.
CPC ...... *H01L 23/49833* (2013.01); *H01L 21/561* (2013.01); *H01L 22/14* (2013.01); *H01L 23/3135* (2013.01); *H01L 23/49816* (2013.01); *H01L 24/73* (2013.01); *H01L 25/18* (2013.01); *H01L 25/50* (2013.01); *H01L 23/552* (2013.01); *H01L 2224/73204* (2013.01)

(58) Field of Classification Search
CPC ........... H01L 25/0657; H01L 23/49833; H01L 21/561; H01L 22/14; H01L 23/3135; H01L 23/49816; H01L 24/73; H01L 25/18; H01L 2224/73204; H01L 21/568; H01L 2224/9212; H01L 2225/06517; H01L 2225/06572; H01L 23/5385; H01L 24/16; H01L 24/32; H01L 24/92; H01L 25/0652; H01L 2224/32225; H01L 2224/48227; H01L 2224/81005; H01L 2224/81815; H01L 2224/97; H01L 2924/15311; H01L 2924/15313; H01L 2924/3025; H01L 2224/16227; H01L 2924/15321

See application file for complete search history.

(56) References Cited

U.S. PATENT DOCUMENTS

| | | | | |
|---|---|---|---|---|
| 2011/0304015 A1* | 12/2011 | Kim | ..................... | H01L 25/0657 257/532 |
| 2013/0175687 A1* | 7/2013 | Hu | ........................ | H01L 25/105 257/738 |

(Continued)

*Primary Examiner* — Jasmine J Clark
(74) *Attorney, Agent, or Firm* — Foley & Lardner LLP

(57) ABSTRACT

The present disclosure provides a semiconductor device package. The semiconductor device package includes a first substrate and a second substrate. The first substrate has a first surface and a second surface opposite to the first surface of the first substrate. The second substrate has a first surface facing the first substrate and a second surface opposite to the first surface of the second substrate. The semiconductor device package also includes a first electronic component disposed on the first surface of the second substrate and electrically connected to the first surface of the second substrate. The semiconductor device package also includes a first encapsulant and a second encapsulant between the first substrate and the second substrate. The first encapsulant is different from the second encapsulant. A method of manufacturing a semiconductor device package is also disclosed.

15 Claims, 42 Drawing Sheets

(51) Int. Cl.
  *H01L 23/31* (2006.01)
  *H01L 21/66* (2006.01)
  *H01L 25/00* (2006.01)
  *H01L 21/56* (2006.01)
  *H01L 23/00* (2006.01)
  *H01L 23/552* (2006.01)

(56) References Cited

U.S. PATENT DOCUMENTS

2016/0225692 A1* 8/2016 Kim .................. H01L 23/49827
2019/0088621 A1  3/2019 Yang et al.
2019/0198432 A1* 6/2019 Matsuzawa ....... H01L 23/49838
2021/0193582 A1* 6/2021 Yu .................... H01L 23/49811

* cited by examiner

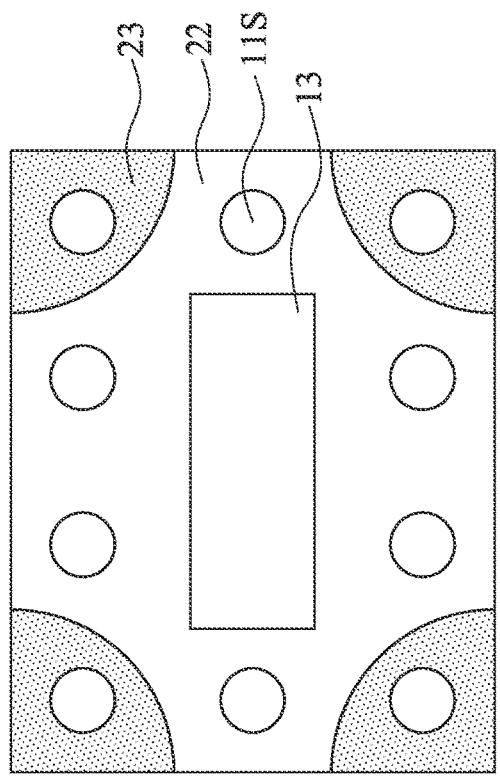
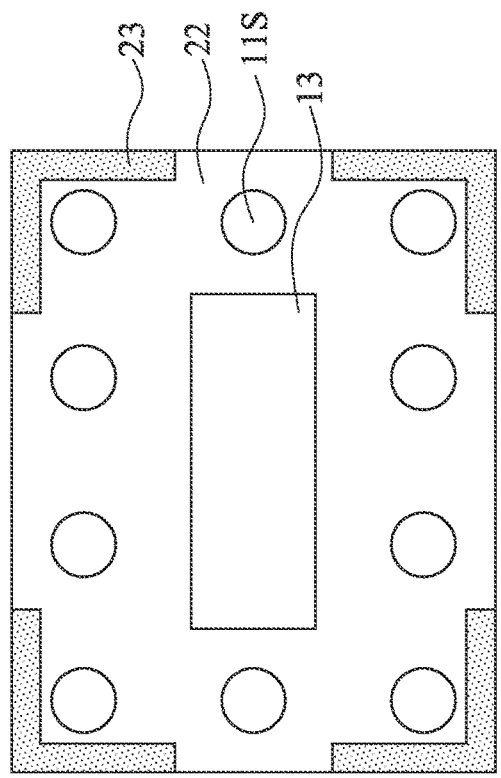

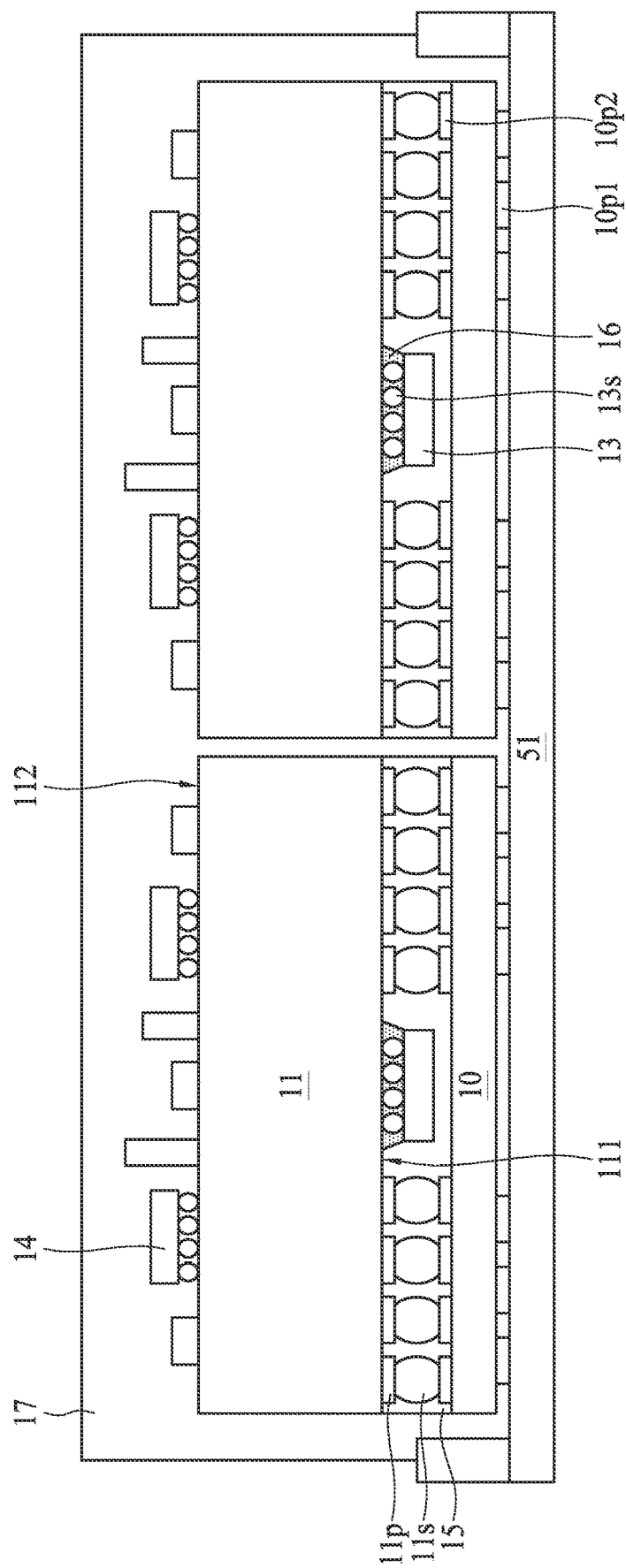
FIG. 5D''''

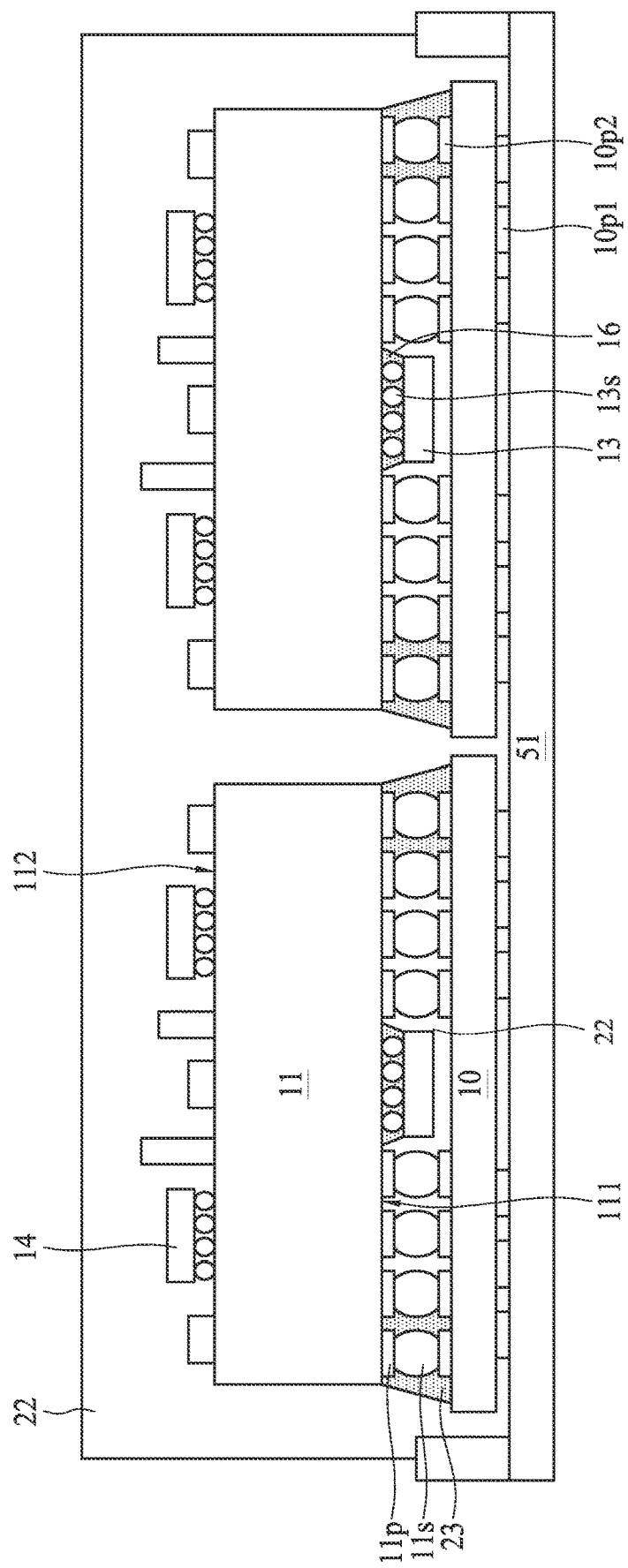
FIG. 6D''''

SEMICONDUCTOR DEVICE PACKAGE

BACKGROUND

1. Technical Field

The present disclosure generally relates to a semiconductor device package and a method of manufacturing the same, and to a semiconductor device package including an electronic component and a method of manufacturing the same.

2. Description of the Related Art

Package on Package (PoP) technique can combine discrete packages, and usually consist of two packages, such as two devices connected through an interposer.

SUMMARY

In one or more embodiments, a semiconductor device package includes a first substrate and a second substrate. The first substrate has a first surface and a second surface opposite to the first surface of the first substrate. The second substrate has a first surface facing the first substrate and a second surface opposite to the first surface of the second substrate. The semiconductor device package also includes a first electronic component disposed on the first surface of the second substrate and electrically connected to the first surface of the second substrate. The semiconductor device package also includes a first encapsulant and a second encapsulant between the first substrate and the second substrate. The first encapsulant is different from the second encapsulant.

In one or more embodiments, a semiconductor device package includes a first substrate and a second substrate. The first substrate has a first surface and a second surface opposite to the first surface of the first substrate. The second substrate has a first surface facing the first substrate and a second surface opposite to the first surface of the second substrate. The semiconductor device package also includes a first electronic component disposed on the first surface of the second substrate and electrically connected to the first surface of the second substrate. The semiconductor device package also includes a first encapsulant between the first substrate and the second substrate. The semiconductor device package also includes a second encapsulant disposed on the second surface of the second substrate. The first encapsulant is different from the second encapsulant.

In one or more embodiments, a method of manufacturing a semiconductor device package includes providing an interposer having a first surface and a second surface opposite to the first surface of the interposer and disposing a first electronic component on the first surface of the interposer. The method also includes electrically testing the first electronic component through the interposer and disposing a second electronic component on the second surface of the interposer.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 2B illustrates a top view of a semiconductor device package in accordance with some embodiments of the present disclosure.

FIG. 2C illustrates a top view of a semiconductor device package in accordance with some embodiments of the present disclosure.

Common reference numerals are used throughout the drawings and detailed descriptions to indicate the same or similar elements. The present disclosure will be more apparent from the following detailed description taken in conjunction with the accompanying drawings.

DETAILED DESCRIPTION

Figure 1:
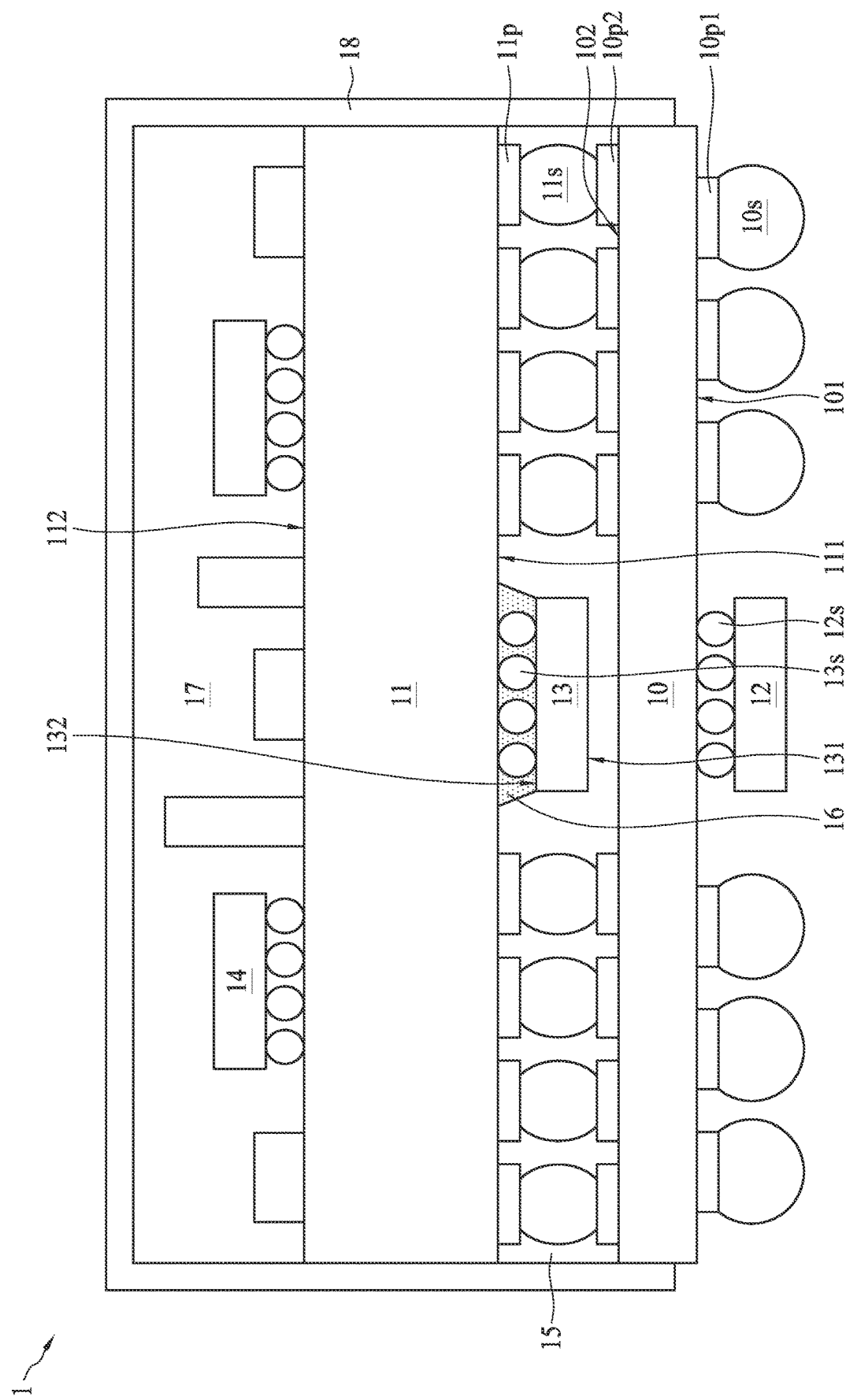
FIG. 1 illustrates a cross-sectional view of a semiconductor device package in accordance with some embodiments of the present disclosure.

The following disclosure provides many different embodiments or example for implementing different features of the provided subject matter. Specific example of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a semiconductor device package 1 in accordance with some embodiments of the present disclosure. The semiconductor device package 1 includes substrates 10, 11, electronic components 12, 13, and 14, encapsulants 15, 16, 17, and a shielding layer 18.

Each of the substrates 10 and 11 may be, for example, an interposer, a printed circuit board, a lead frame, or other substrate types. Each of the substrates 10 and 11 may be, for example, a paper-based copper foil laminate, a composite copper foil laminate, or a polymer-impregnated glass-fiber-based copper foil laminate. Each of the substrates 10 and 11 may be, or may include, an interconnection structure, such as a redistribution layer (RDL) and/or a grounding element.

The substrate 10 has a surface 101 and a surface 102 opposite to the surface 101. The substrate 10 may include one or more conductive pads $10p1$ in proximity to, adjacent to, or embedded in and exposed at the surface 101 of the substrate 10. The substrate 10 may include a solder resist (not shown) on the surface 101 of the substrate 10 to fully expose or to expose at least a portion of the conductive pads $10p1$ for electrical connections. Electrical contacts $10s$ (e.g., solder balls) are disposed on the conductive pads $10p1$ and can provide electrical connections between the semiconductor device package 1 and external components (e.g., external circuits or circuit boards). In some embodiments, the electrical contact $10s$ includes a controlled collapse chip connection (C4) bump, a ball grid array (BGA) or a land grid array (LGA).

The electronic component 12 is disposed on the surface 101 of the substrate 10 and electrically connected with the substrate 10 through a flip-chip technique (such as connected through an electrical contact $12s$), a wire bonding technique, or other suitable technique. The electronic component 12 may be a chip, a die including a semiconductor substrate, a semiconductor memory (e.g., a dynamic random-access memory (DRAM)), or the likes.

The substrate 11 has a surface 111 facing the surface 102 of the substrate 10 and a surface 112 opposite to the surface 111. The substrate 11 may include one or more conductive pads 11p in proximity to, adjacent to, or embedded in and exposed at the surface 111 of the substrate 11. The substrate 11 may include a solder resist (not shown) on the surface 111 of the substrate 11 to fully expose or to expose at least a portion of the conductive pads 11p for electrical connections. Electrical contacts 11s (e.g., solder balls) are disposed on the conductive pads 11p and can provide electrical connections between the substrate 11 and the substrate 10. In some embodiments, the electrical contact 11s may include, for example, eutectic Sn/Pb, high-lead solder, lead-free solder, pure tin solder, or other types of solders. In some embodiments, the height (or the stand-off) of the electrical contact 11s (i.e., the gap between the surface 111 and the surface 102) is from about 160 micrometers (μm) to about 180 μm.

In some embodiments, the substrate 11 may have a thickness from approximately 100 μm to approximately 160 μm, such as about 110 μm, about 120 μm, about 130 μm, about 140 μm, and about 150 μm. In some embodiments, the substrate 11 may have a relative thinner thickness so as to possess a qualified thermal conductivity. In some embodiments, the electronic component 13 can be inspected under a test (such as an active temperature control (ATC) test) to identify know good die (KGD) through the electrical contact 11s on the substrate 11. However, the thickness of the substrate 11 may be designed depending on design specifications, and the present disclosure is not limited thereto.

The electronic component 13 is disposed on the surface 111 of the substrate 11 and electrically connected to the surface 111 of the substrate 11 through an electrical contact 13s. In some embodiments, the electronic component 13 may be compression bonded and/or thermocompression bonded on the surface 111 of the substrate 11. In some embodiments, a reflow operation may be carried out for the electronic component 13. The electronic component 13 has a surface 132 (such as an active surface) facing the surface 111 of the substrate 11 and a surface 131 (such as a backside surface) opposite to the surface 132. In some embodiments, the electrical contact 13s may include a micro bump, a C4 bump, a BGA or an LGA. In some embodiments, the electronic component 13 may be a chip, a die including a semiconductor substrate, a central processing unit (CPU), a graphics processing unit (GPU), an accelerated processing unit (APU), or the likes. The electronic component 13 may include one or more integrated circuit devices (such as active devices and/or passive devices) and one or more overlying interconnection structures therein. In some embodiments, the electronic component 13 may have fine-pitch input/output (I/O) connections. For example, the bump pitch of the electrical contact 13s may be equal to or less than 100 μm, equal to or less than 75 μm, equal to or less than 60 μm, or equal to or less than 40 μm. For example, a gap between the surface 132 and the substrate 11 is equal to or less than 50 μm, 40 μm, 30 μm, or less.

The encapsulant 16 is disposed between the electronic component 13 and the substrate 11. The encapsulant 16 surrounds the electrical contact 13s. In some embodiments, the encapsulant 16 may include an underfill. In some embodiments, the encapsulant 16 may include an epoxy resin, a molding compound (e.g., an epoxy molding compound or other molding compounds), a polyimide (PI), a phenolic compound or material, material including a silicone dispersed therein, or a combination thereof.

The encapsulant 15 is disposed on the surface 111 of the substrate 11 to cover and encapsulate the electronic component 13. The encapsulant 15 covers or encapsulates the encapsulant 16. The encapsulant 15 is in contact with the encapsulant 16. The encapsulant 15 also covers or encapsulates the electrical contact 11s. In some embodiments, the electrical contact 11s may be deformed under a reflow process (such as the operation illustrated in FIG. 5D and FIG. 5D'''), which may make the connection between the electrical contact 11s and the conductive pad 10p2 fail and cause the substrate 11 to tilt (or out of position). The encapsulant 15 may be used to protect the electrical contact 11s from being deformed, which can improve the reliability of the electrical contact 11s.

In some embodiments, the encapsulant 15 may include, for example, one or more organic materials (e.g., a molding compound, bismaleimide triazine (BT), a PI, a polybenzoxazole (PBO), a solder resist, an Ajinomoto build-up film (ABF), a polypropylene (PP), an epoxy-based material, or a combination of two or more thereof), inorganic materials (e.g., silicon, a glass, a ceramic, quartz, or a combination of two or more thereof), liquid-film material(s) or dry-film material(s), or a combination of two or more thereof.

In some embodiments, the encapsulant 15 and the encapsulant 16 may have different materials. For example, the encapsulant 15 and the encapsulant 16 may have different kinds of materials. For example, the fillers of the encapsulant 15 and the encapsulant 16 may have different sizes. For example, the size of the fillers of the encapsulant 15 may be greater than that of the encapsulant 16. For example, the size of the fillers of the encapsulant 15 may be at least three times greater than that of the encapsulant 16. For example, the size of the fillers of the encapsulant 15 may range from about 30 μm to about 10 μm. For example, the size of the fillers of the encapsulant 16 may range from about 10 μm to about 1 μm.

The electronic component 14 is disposed on the surface 112 of the substrate 11 and electrically connected with the substrate 11 through a flip-chip technique, a wire bonding technique, or other suitable technique. In some embodiments, the electronic component 14 may be compression bonded and/or thermocompression bonded on the surface 112 of the substrate 11 through a solder ball. In some embodiments, a reflow operation may be carried out for the electronic component 14. The electronic component 14 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The encapsulant 17 is disposed on the surface 112 of the substrate 11 to cover and encapsulate the electronic component 14. In some embodiments, the encapsulant 17 may include material as described above for the encapsulant 15. In some embodiments, the encapsulant 17 and encapsulant 15 are formed in separate operations. In some embodiments, the encapsulant 17 and encapsulant 15 may have the same material. In some embodiments, the encapsulant 17 and encapsulant 15 may have different materials.

The shielding layer 18 is disposed on an external surface of the encapsulant 17 and covers the encapsulant 17, a lateral surface of the substrate 11 and a lateral surface of the substrate 10. The shielding layer 18 may be electrically connected to a grounding element of the substrate 10. In some embodiments, the shielding layer 18 is a conformal shield. In some embodiments, the shielding layer 18 is a conductive thin film and may include, for example, aluminum (Al), copper (Cu), chromium (Cr), tin (Sn), gold (Au), silver (Ag), nickel (Ni) or stainless steel, or a mixture, an alloy, or other combination thereof.

Figure 2A:
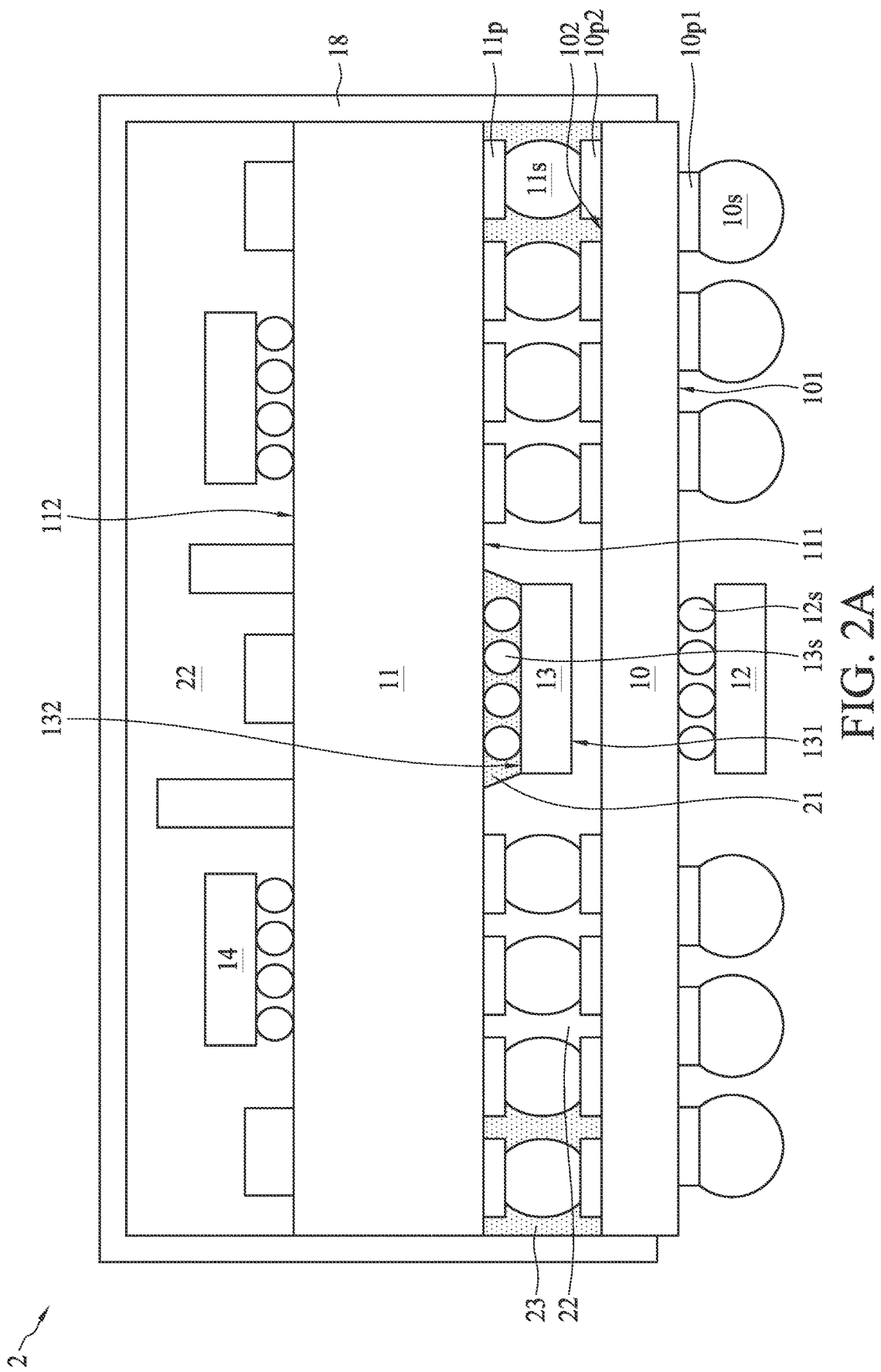
FIG. 2A illustrates a cross-sectional view of a semiconductor device package in accordance with some embodiments of the present disclosure.

FIG. 2A illustrates a cross-sectional view of a semiconductor device package 2 in accordance with some embodiments of the present disclosure. The semiconductor device package 2 of FIG. 2A is similar to the semiconductor device package 1 of FIG. 1, and the differences therebetween are described below.

The semiconductor device package 2 includes an encapsulant 21 surrounds the electrical contact 13s. In some embodiments, the encapsulant 21 may include an underfill. In some embodiments, the encapsulant 21 may include material as noted above for the encapsulant 16 in FIG. 1.

An encapsulant 22 is disposed on the surface 111 of the substrate 11 to cover and encapsulate the electronic component 13. The encapsulant 22 also surrounds the encapsulant 21. In some embodiments, the encapsulant 22 also surrounds the electrical contact 11s. In some embodiments, the encapsulant 22 may include material as noted above for the encapsulant 15. In some embodiments, the encapsulant 22 may include material different from the encapsulant 21.

An encapsulant 23 is disposed on the surface 111 of the substrate 11 and surrounds the encapsulant 22. In some embodiments, the encapsulant 23 also surrounds the electrical contact 11s. In some embodiments, the encapsulant 23 is disposed on a periphery of the substrate 11. In some embodiments, the encapsulant 23 is disposed on a periphery of the substrate 10. In some embodiments, the encapsulant 23 is disposed on an outer edge of the substrate 11. In some embodiments, the encapsulant 23 is disposed on an outer edge of the substrate 10. For example, referring to top views of FIGS. 2B and 2C, the encapsulant 23 is disposed on a corner of the substrate 11. In FIG. 2B, the encapsulant 23 surrounds the electrical contact 11s and the encapsulant 22. In FIG. 2B, the encapsulant 23 is spaced apart from the electrical contact 11s. In some embodiments, the encapsulant 23 can provide structural support to the substrate 11 and prevent the substrate 11 from tilting under a reflow process (such as the operation illustrated in FIG. 6D and FIG. 6D''').

In some embodiments, the encapsulant 23 may include material different from the encapsulant 22. For example, the encapsulant 23 and the encapsulant 22 may have different kinds of materials. For example, the encapsulant 23 and the encapsulant 22 may have different filler sizes.

In some embodiments, the electrical contact 11s may be protected from a reflow process (such as the operation illustrated in FIG. 6D and FIG. 6D''') by the encapsulant 23. In some embodiments, the encapsulant 23 improves the reliability of the electrical contact 11s.

Figure 3:
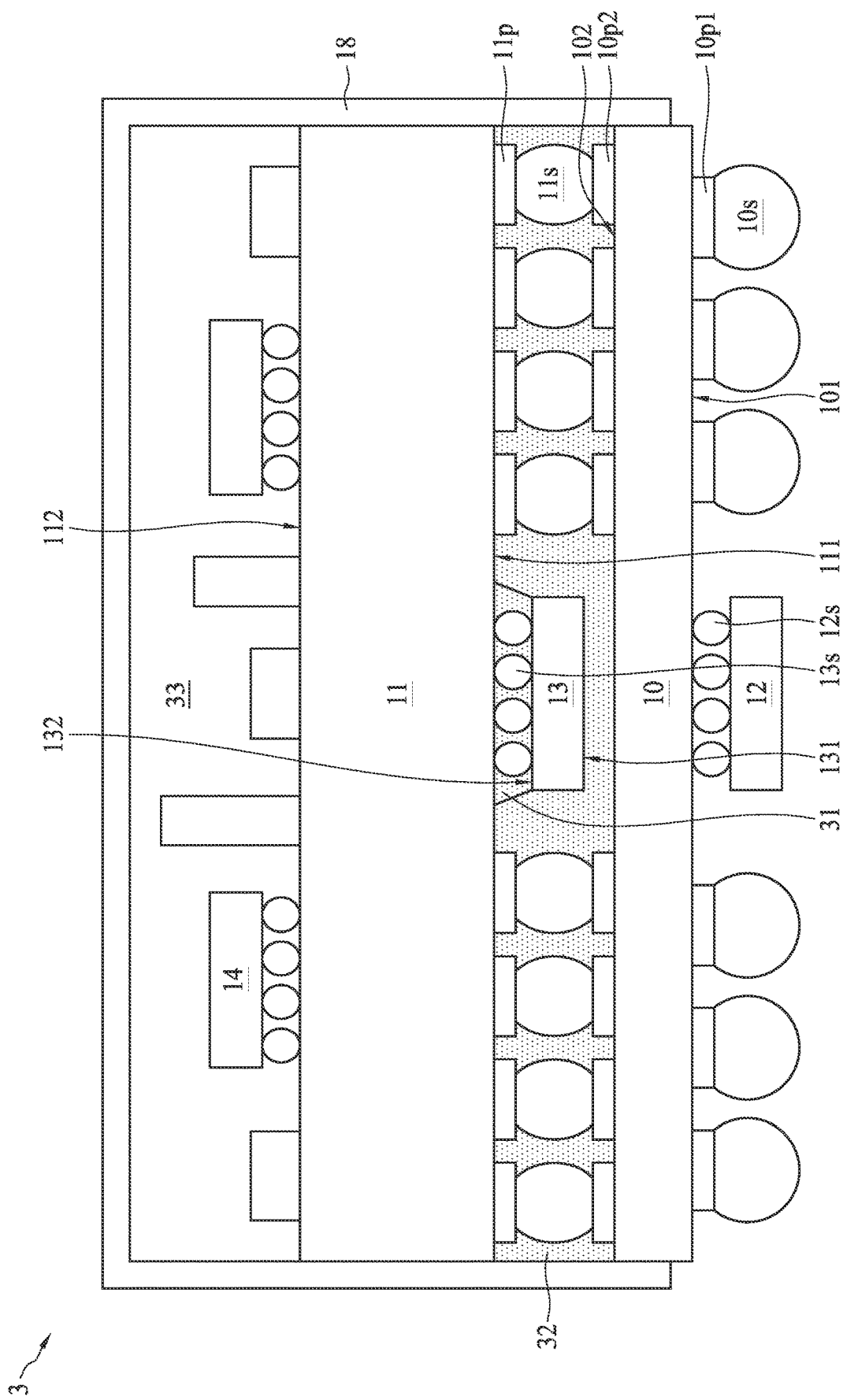
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 of FIG. 3 is similar to the semiconductor device package 1 of FIG. 1, and the differences therebetween are described below.

The semiconductor device package 3 includes an encapsulant 31 surrounds the electrical contact 13s. In some embodiments, the encapsulant 31 may include an underfill. In some embodiments, the encapsulant 31 may include material as noted above for the encapsulant 16 in FIG. 1.

An encapsulant 32 is disposed on the surface 111 of the substrate 11 to cover and encapsulate the electronic component 13. The encapsulant 32 also surrounds the encapsulant 31. In some embodiments, the encapsulant 32 also surrounds the electrical contact 11s. In some embodiments, the encapsulant 32 may include material as noted above for the encapsulant 16 in FIG. 1. In some embodiments, the encapsulant 32 and the encapsulant 31 may include the same material. In some embodiments, the encapsulant 32 forms an interface with the encapsulant 31.

In some embodiments, the electrical contact 11s may be protected from a reflow process (such as the operation illustrated in FIG. 7D and FIG. 7D''') by the encapsulant 32. In some embodiments, the encapsulant 32 improves the reliability of the electrical contact 11s.

Figure 4:
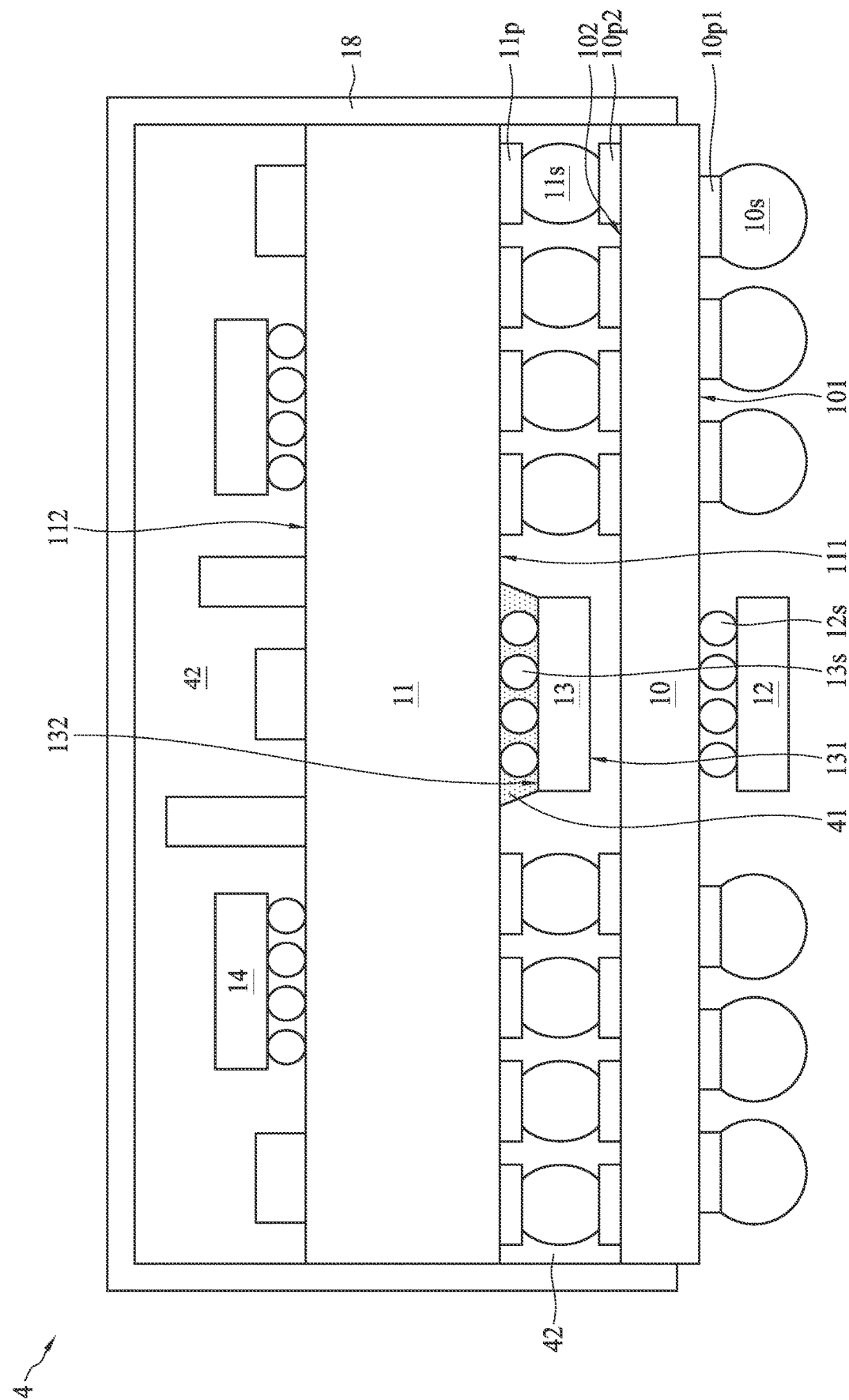
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 of FIG. 4 is similar to the semiconductor device package 1 of FIG. 1, and the differences therebetween are described below.

The semiconductor device package 4 includes an encapsulant 41 surrounds the electrical contact 13s. In some embodiments, the encapsulant 41 may include an underfill. In some embodiments, the encapsulant 41 may include material as noted above for the encapsulant 16 in FIG. 1.

An encapsulant 42 is disposed on the surface 111 of the substrate 11 to cover and encapsulate the electronic component 13. The encapsulant 42 is also disposed on the surface 112 of the substrate 11 to cover and encapsulate the electronic component 14. In comparison with the encapsulant 15 and the encapsulant 17 in FIG. 1, the encapsulant 42 is one-time molded.

FIG. 5A, FIG. 5B, FIG. 5C, FIG. 5D, FIG. 5E, FIG. 5F, and FIG. 5G are cross-sectional views of a semiconductor device package at various stages of fabrication, in accordance with some embodiments of the present disclosure. At least some of these figures have been simplified to better understand the aspects of the present disclosure.

Figure 5A:
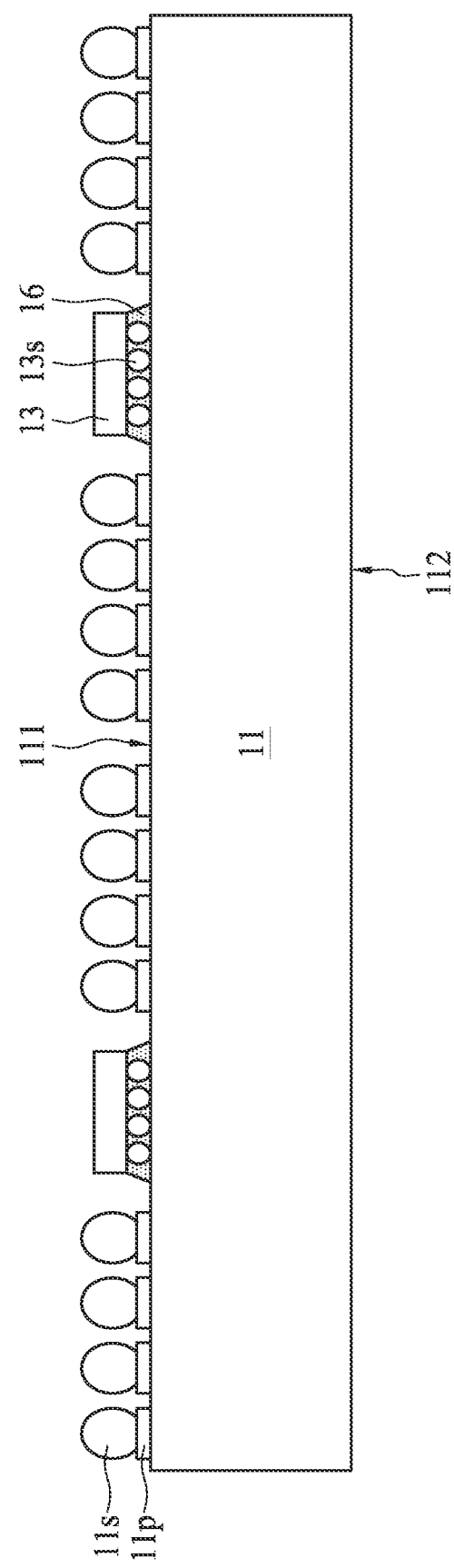
FIG. 5A illustrates one or more stages of a method of manufacturing a semiconductor device package in accordance with some embodiments of the present disclosure.

Referring to FIG. 5A, a substrate 11 is provided. An electronic component 13 is disposed on a surface 111 of the substrate 11 and electrically connected with the substrate 11 through an electrical contact 13s. In some embodiments, the electrical contact 13s may be formed by using an evaporation operation, an electrolytic plating operation, an electroless plating operation, a ball drop operation, or a screen printing operation. In some embodiments, the electronic component 13 may be compression bonded and/or thermocompression bonded to the substrate 11. In some embodiments, the electronic component 13 may be reflowed. An encapsulant 16 (such as an underfill) is disposed between the electronic component 13 and the substrate 11 to surround the electrical contact 13s.

A conductive pad 11p is formed over the surface 111 of the substrate 11. In some embodiments, the conductive pad 11p may be formed by physical vapor deposition (PVD), chemical vapor deposition (CVD), electrolytic plating, electroless plating, or other suitable metal deposition process. An electrical contact 11s is mounted on the conductive pad 11p and may be reflowed. In some embodiments, the top surface of the electrical contact 11s is higher than or equal to the top surface of the electronic component 13.

Figure 5B:
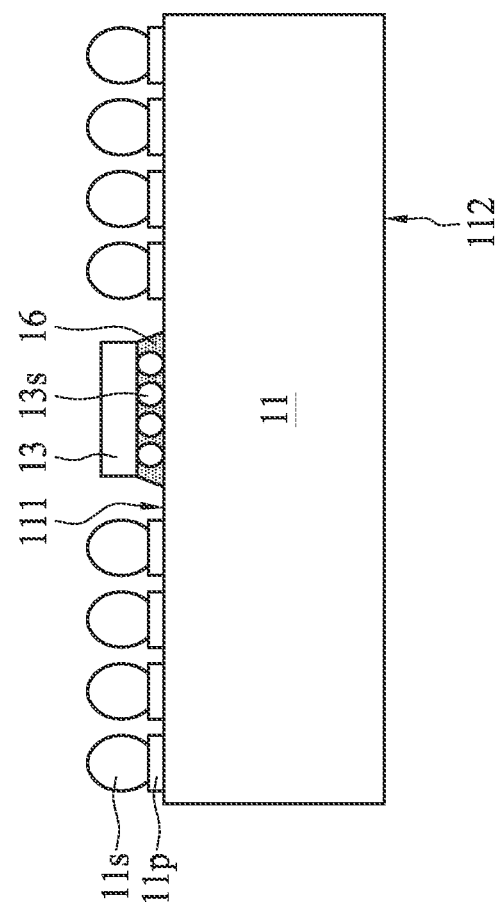
FIG. 5B illustrates one or more stages of a method of manufacturing a semiconductor device package in accordance with some embodiments of the present disclosure.

Referring to FIG. 5B, a singulation is performed to separate out individual structures in FIG. 5A. That is, the singulation is performed through the saw streets or scribes of the substrate 11. The singulation may be performed, for example, by using a dicing saw, laser, or other appropriate cutting technique.

Figure 5C:
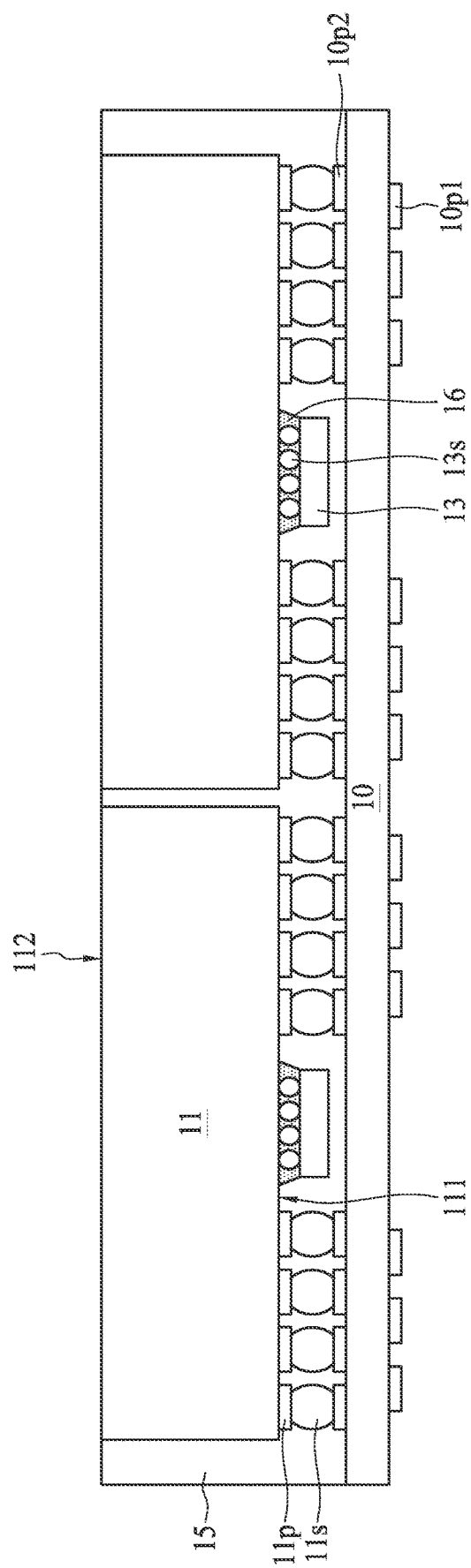
FIG. 5C illustrates one or more stages of a method of manufacturing a semiconductor device package in accordance with some embodiments of the present disclosure.

Referring to FIG. 5C, the individual structures in FIG. 5B are flipped and disposed on a substrate 10. In some embodiments, the substrate 11 may be compression bonded and/or thermocompression bonded to the substrate 10.

In some comparative embodiments, the structure (such as an interposer strip) of FIG. 5A may be flipped and disposed on the substrate 10 without being singulated. However, the stress from the interposer strip may cause warpage issue. By singulating the interposer strip and then disposed individual interposer on the substrate 10, the warpage issue can be solved.

An encapsulant 15 is disposed on the substrate 10 to cover the substrate 11. In some embodiments, the encapsulant 15 may be formed by, for a paste printing, compressive molding, transfer molding, liquid encapsulant molding, vacuum lamination, spin coating, or other suitable applicators. In some embodiments, a planarization operation (such as chemical mechanical planarization (CMP), an etching process, or laser direct ablation (LDA)) may be performed to planarize the encapsulant 15 and expose the surface 112 of the substrate 11.

Figure 5D:
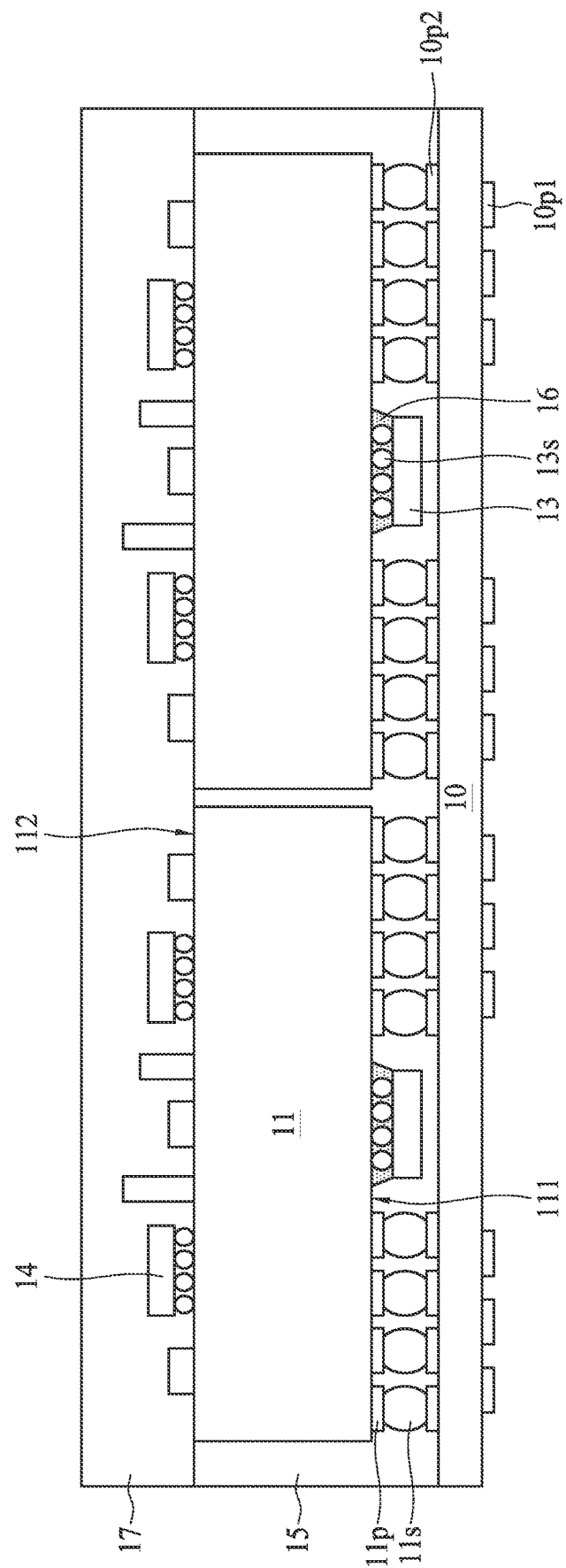
FIG. 5D illustrates one or more stages of a method of manufacturing a semiconductor device package in accordance with some embodiments of the present disclosure.
Figure 5D:
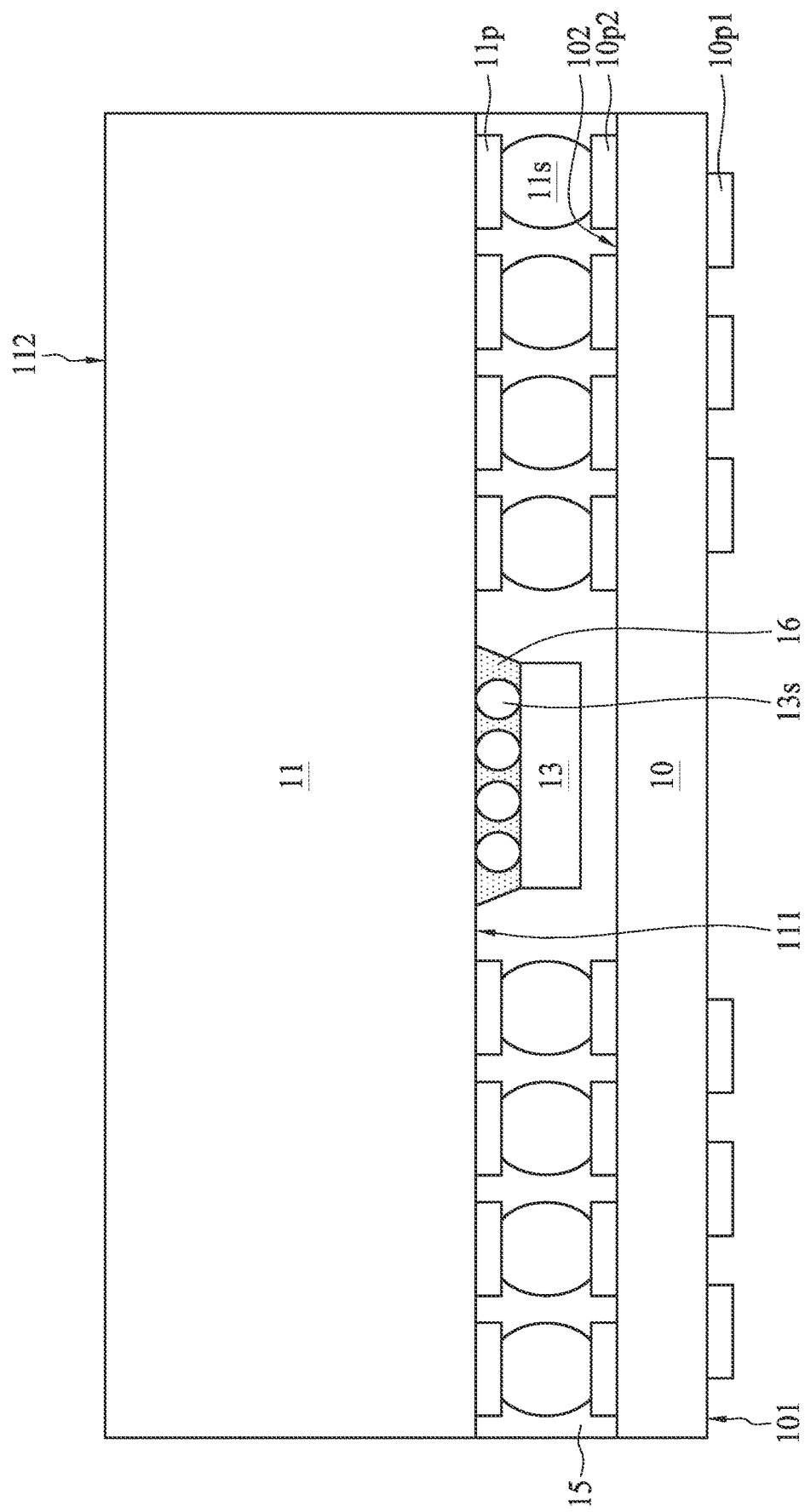
Figure 5D:
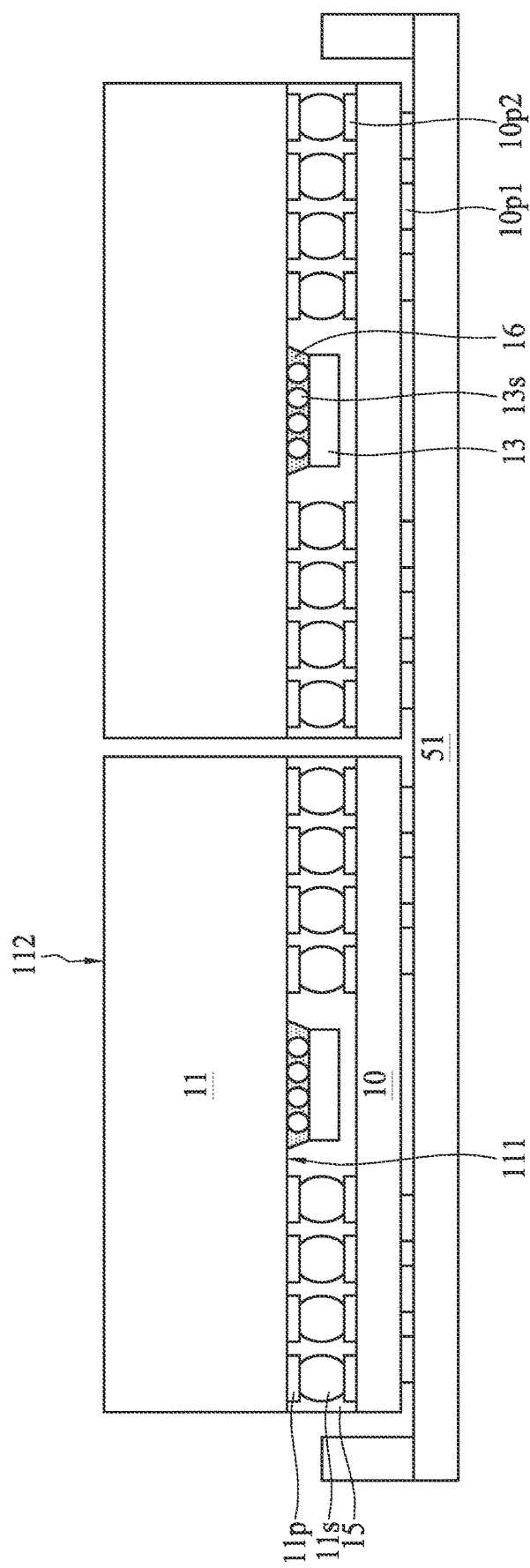

Referring to FIG. 5D, an electronic component 14 is disposed on the surface 112 of the substrate 11 and electrically connected with the substrate 11. In some embodiments, the electronic component 14 may be compression bonded and/or thermocompression bonded to the substrate 11. In some embodiments, the electronic component 14 may be reflowed. In some embodiments, as mentioned, the encapsulant 15 may protect the electrical contact 11$s$ and improves the reliability of the electrical contact 11$s$. An encapsulant 17 is disposed to cover the electronic component 14. In some embodiments, the encapsulant 17 and encapsulant 15 are formed in separated operations. In some embodiments, the encapsulant 17 and encapsulant 15 may choose to have different materials.

In some embodiments, after the operation of FIG. 5B and before the operation of FIG. 5C, the individual structure in FIG. 5B can be inspected under a test (such as an ATC test) to identify KGD of the electronic component 13 through the electrical contact 11$s$ on the substrate 11.

Alternatively, after the operation of FIG. 5C and before the operation of FIG. 5D, the structure in FIG. 5C can be inspected under a test (such as an ATC test) to identify KGD of the electronic component 13 through the electrical contact 10$p1$ on the substrate 10.

In some embodiments, the ATC test may be conducted after the operation of FIG. 5D. However, scrapping the failed structure after the operation of FIG. 5D would decrease the yield rate and increase the manufacturing cost. By conducting the ATC test prior to the operation of FIG. 5D, such issues can be solved. For example, the identification of KGD of the electronic component 13 can be conducted before mounting the electronic component 14 on the substrate 11.

Figure 5E:
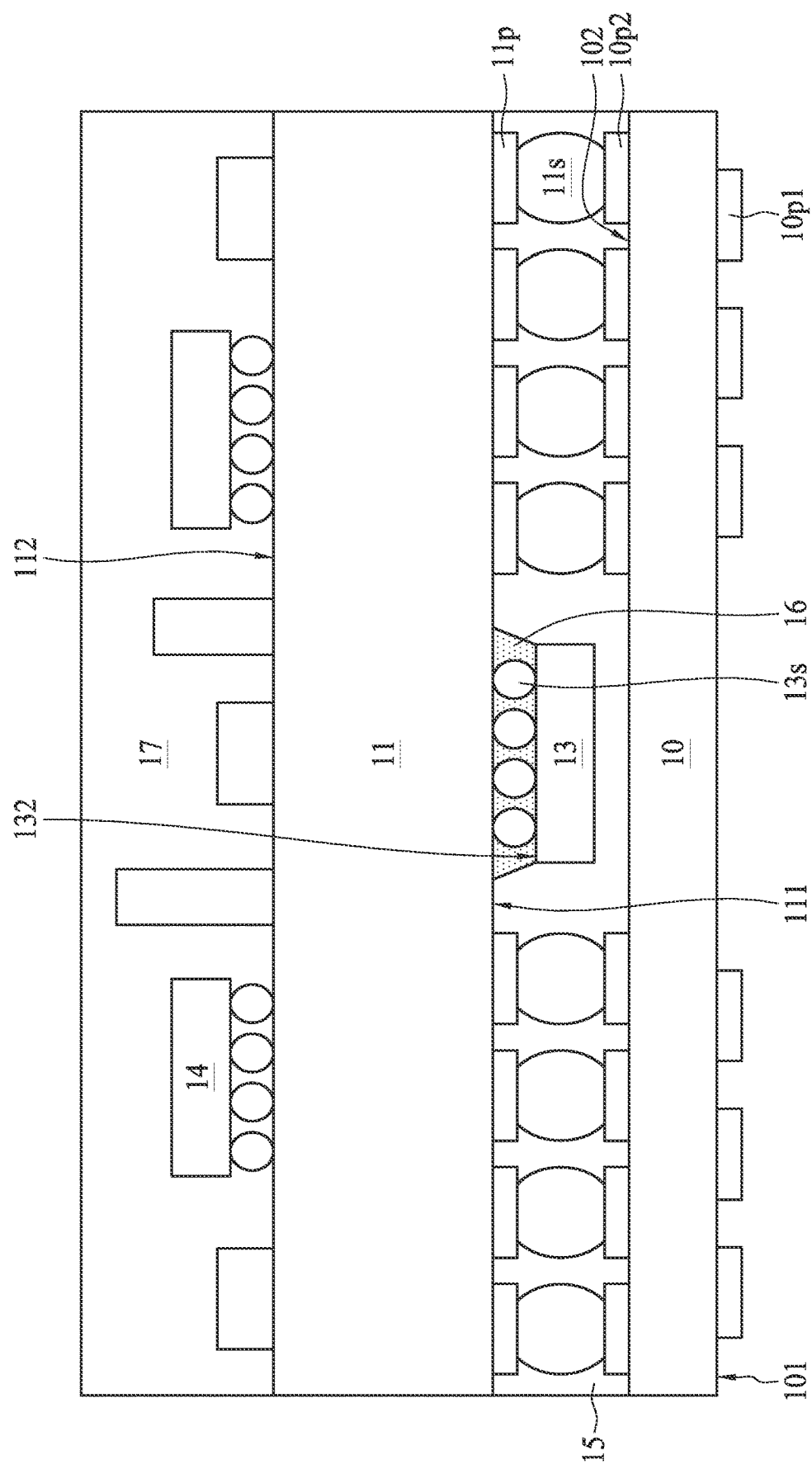
FIG. 5E illustrates one or more stages of a method of manufacturing a semiconductor device package in accordance with some embodiments of the present disclosure.

Referring to FIG. 5E, a singulation is performed to separate out individual structures in FIG. 5D. That is, the singulation is performed through the saw streets or scribes of the substrate 10.

Figure 5F:
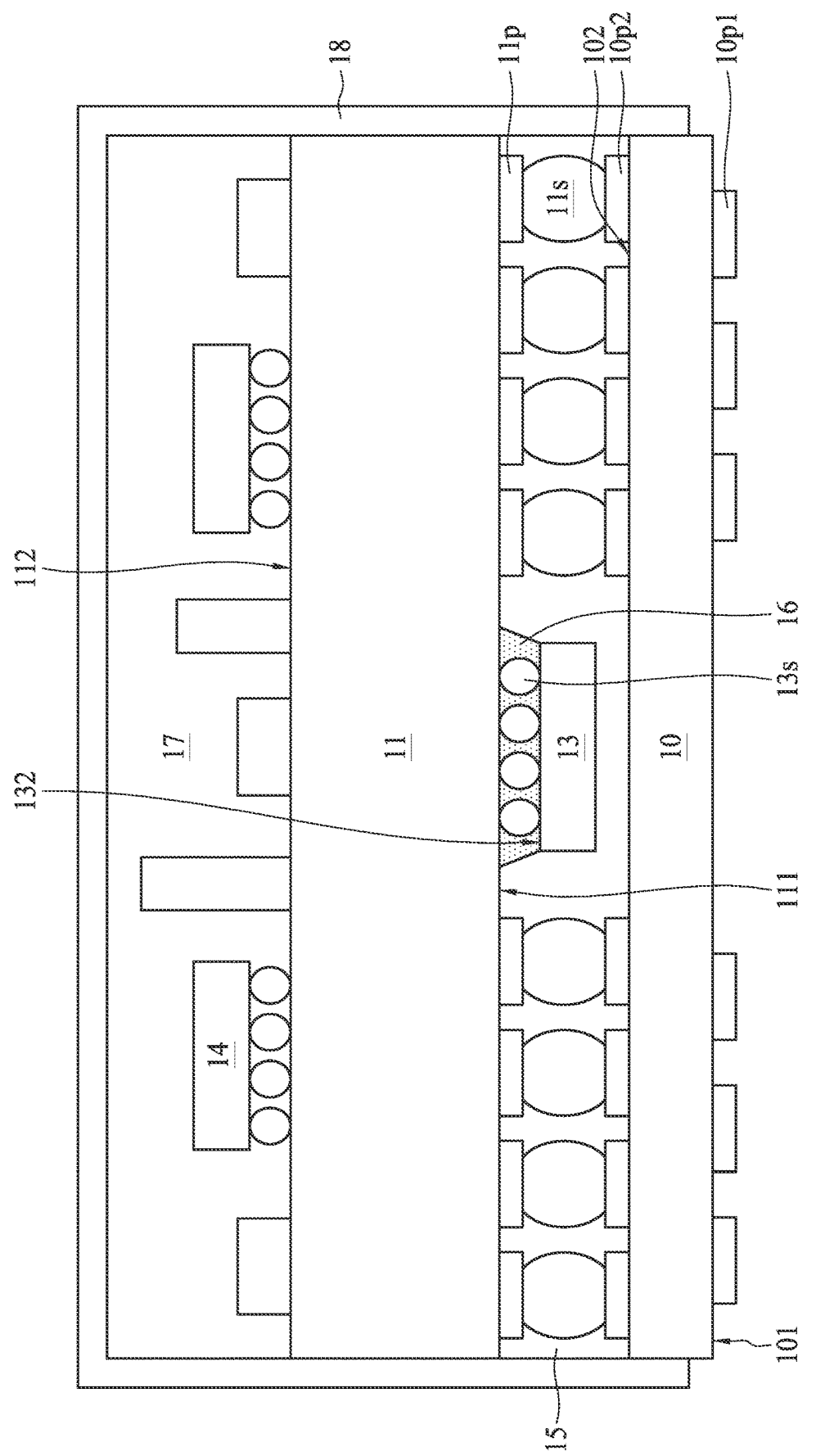
FIG. 5F illustrates one or more stages of a method of manufacturing a semiconductor device package in accordance with some embodiments of the present disclosure.

Referring to FIG. 5F, a shielding layer 18 is disposed on an external surface of the encapsulant 17 and covers the encapsulant 17, a lateral surface of the substrate 11, and a lateral surface of the substrate 10. The shielding layer 18 may be formed by, for example, a plating process.

Figure 5G:
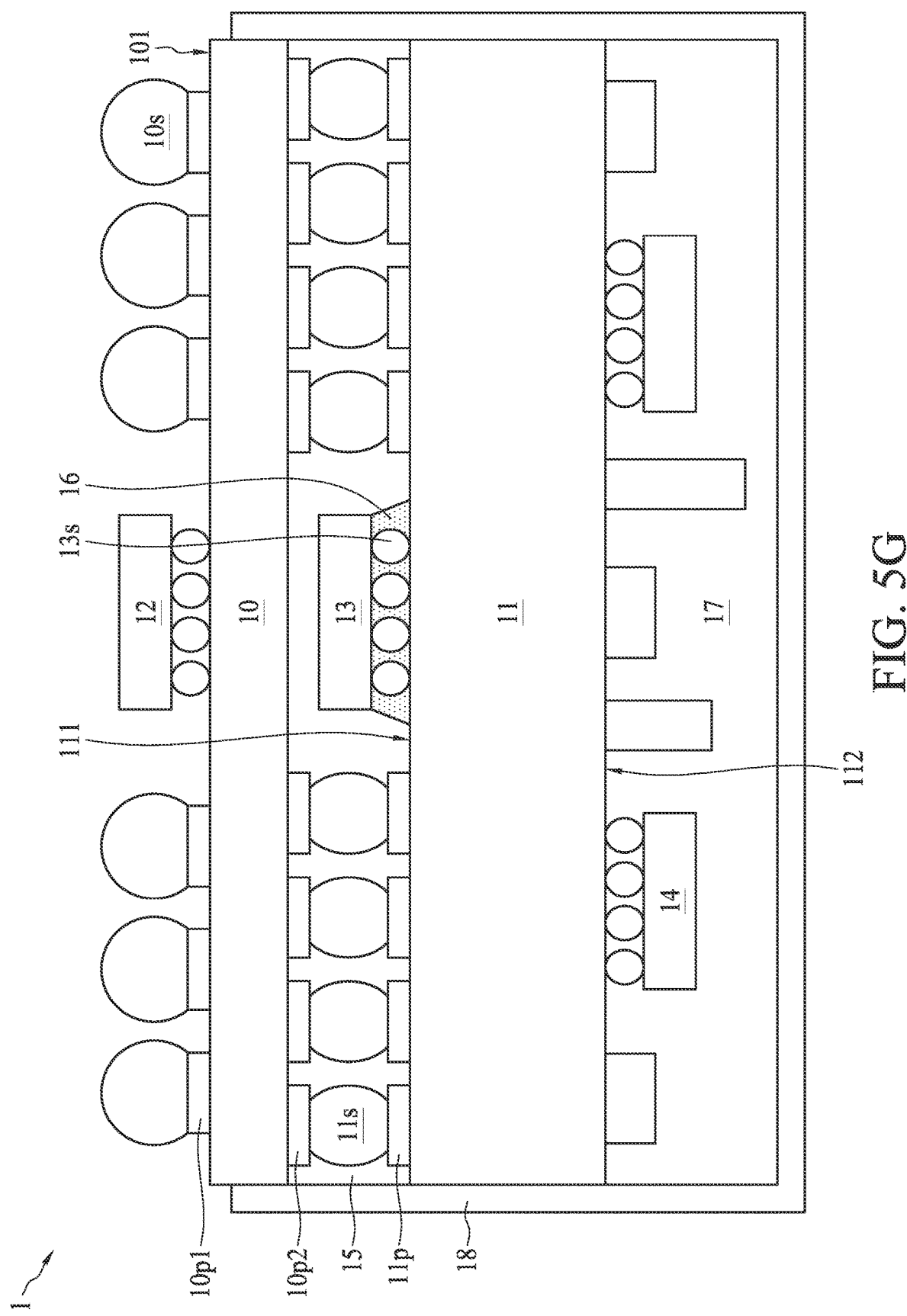
FIG. 5G illustrates one or more stages of a method of manufacturing a semiconductor device package in accordance with some embodiments of the present disclosure.

Referring to FIG. 5G, an electronic component 12 may be disposed on a surface 101 of the substrate 10 and electrically connected with the substrate 10. Electrical contact 10$s$ may be disposed on the surface 101 of the substrate 10 to provide electrical connections to external components. The final structure obtained from the operations of FIG. 5A, FIG. 5B, FIG. 5C, FIG. 5D, FIG. 5E, FIG. 5F, and FIG. 5G may be similar to the semiconductor device package 1 of FIG. 1.

In some embodiments, the operation of FIG. 5D may be replaced with the operations of FIG. 5D', FIG. 5D", and FIG. 5D'''.

FIG. 5D', FIG. 5D", and FIG. 5D''' are cross-sectional views of a semiconductor device package at various stages of fabrication, in accordance with some embodiments of the present disclosure. At least some of these figures have been simplified to better understand the aspects of the present disclosure.

Referring to FIG. 5D', after the operation of FIG. 5C (in which the individual structures in FIG. 5B are flipped and disposed on the substrate 10), a singulation is performed to separate out individual structures in FIG. 5C. That is, the singulation is performed through the saw streets or scribes of the substrate 10.

Referring to FIG. 5D", the individual structures in FIG. 5D' is disposed on a carrier 51 for physical support. In some embodiments, the carrier 51 may be replaced with a double-sided tape, a thermal release layer, a UV release layer, or another appropriate interface layer.

Referring to FIG. 5D''', the electronic component 14 is disposed on the surface 112 of the substrate 11 and electrically connected with the substrate 11. The encapsulant 17 is disposed to cover the electronic component 14.

In some embodiments, after the operation of FIG. 5D' and before the operation of FIG. 5D''', the individual structure in FIG. 5D' can be inspected under a test (such as an ATC test) to identify KGD of the electronic component 13 through the electrical contact 10$p1$ on the substrate 10.

After removing the carrier 51 from the encapsulant 17 and singulating the structure in FIG. 5D''', the process may proceed to the operation of FIG. 5E.

FIG. 6A, FIG. 6B, FIG. 6C, FIG. 6D, FIG. 6E, FIG. 6F, and FIG. 6G are cross-sectional views of a semiconductor device package at various stages of fabrication, in accordance with some embodiments of the present disclosure. At least some of these figures have been simplified to better understand the aspects of the present disclosure.

Figure 6A:
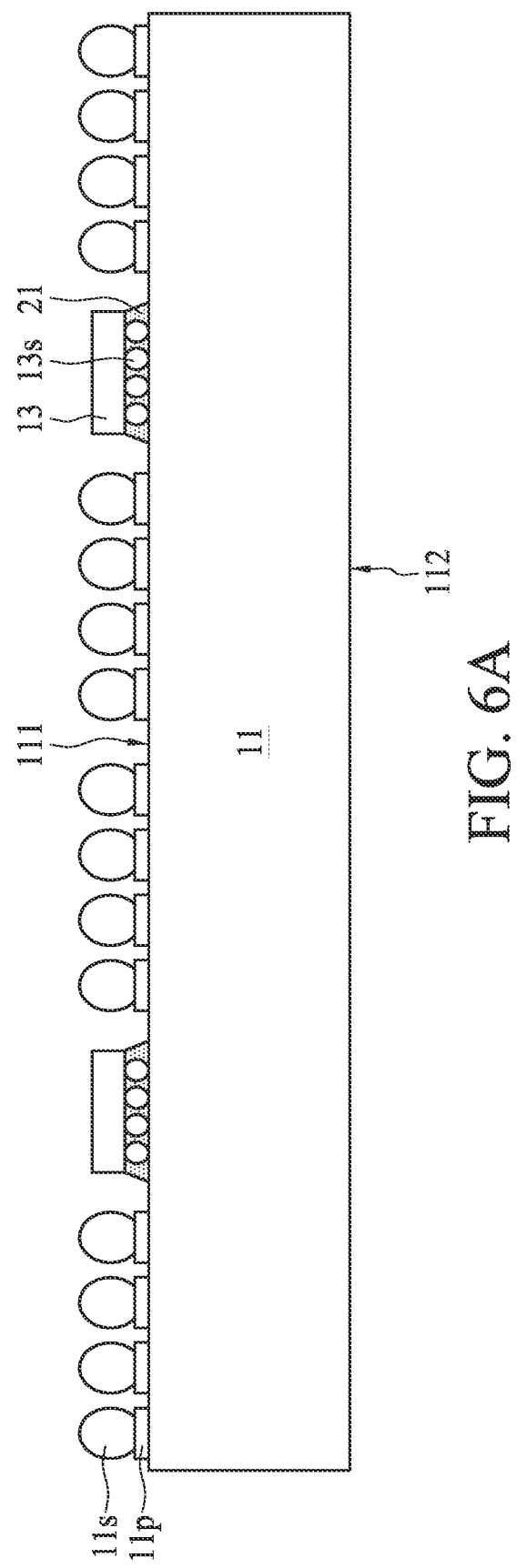
FIG. 6A illustrates one or more stages of a method of manufacturing a semiconductor device package in accordance with some embodiments of the present disclosure.

The operation of FIG. 6A is similar to the operation of FIG. 5A. The operation of FIG. 6B is similar to the operation of FIG. 5B.

Figure 6B:
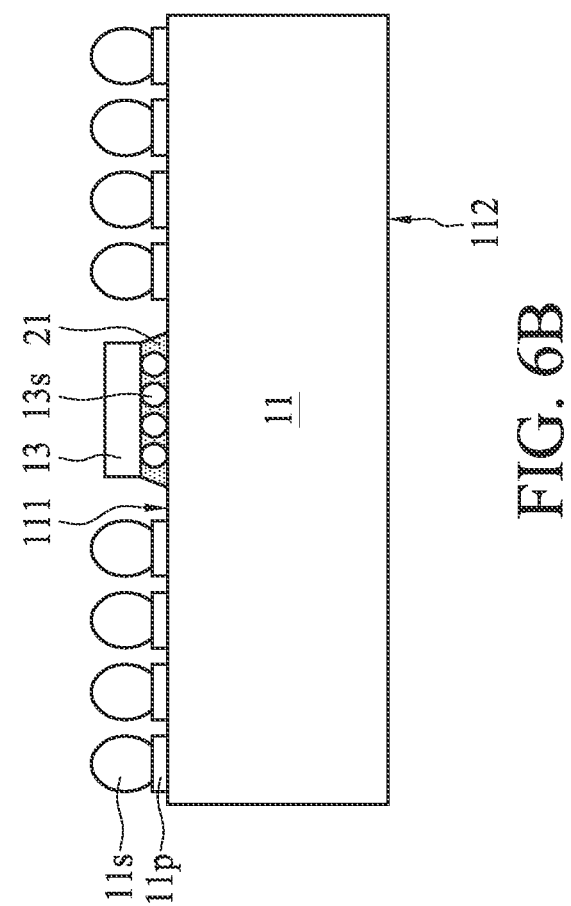
FIG. 6B illustrates one or more stages of a method of manufacturing a semiconductor device package in accordance with some embodiments of the present disclosure.
Figure 6C:
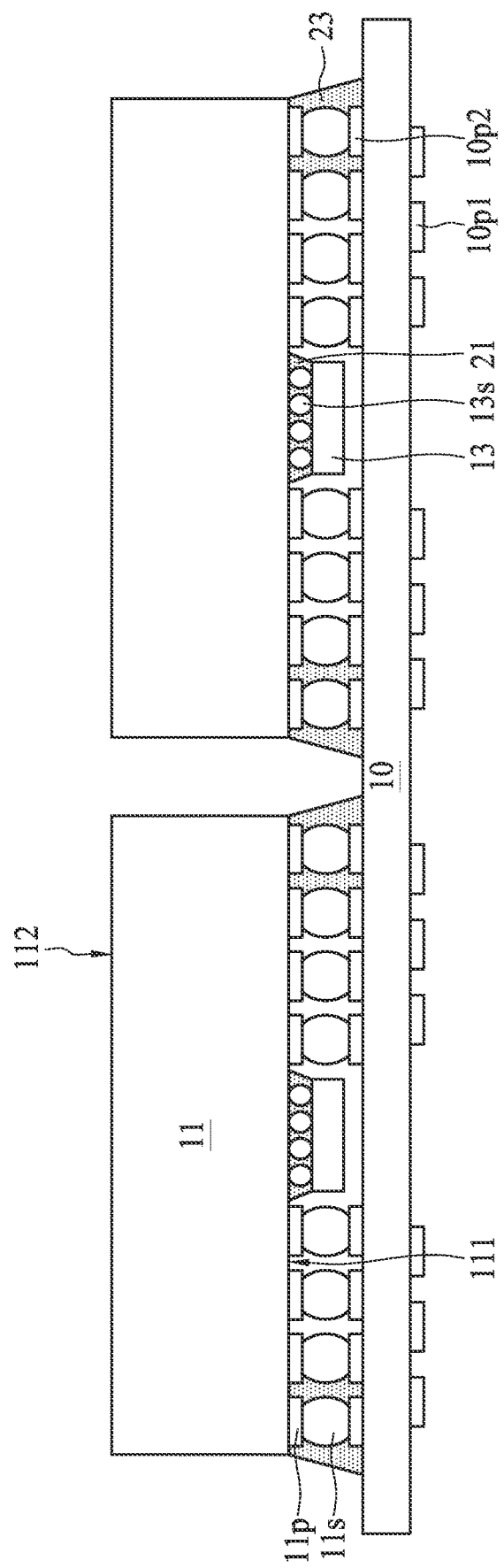
FIG. 6C illustrates one or more stages of a method of manufacturing a semiconductor device package in accordance with some embodiments of the present disclosure.

Referring to FIG. 6C, the individual structures in FIG. 6B are flipped and disposed on a substrate 10. An encapsulant 23 is disposed on the periphery of the substrate 10.

Figure 6D:
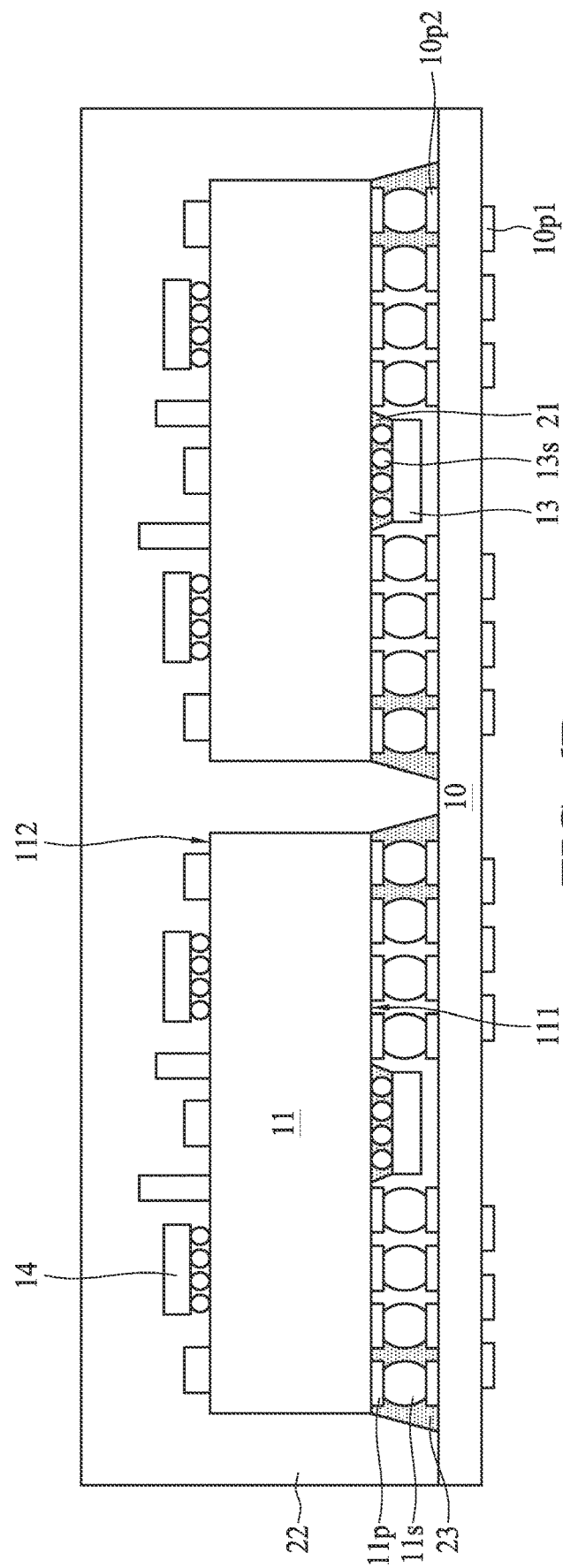
FIG. 6D illustrates one or more stages of a method of manufacturing a semiconductor device package in accordance with some embodiments of the present disclosure.
Figure 6D:
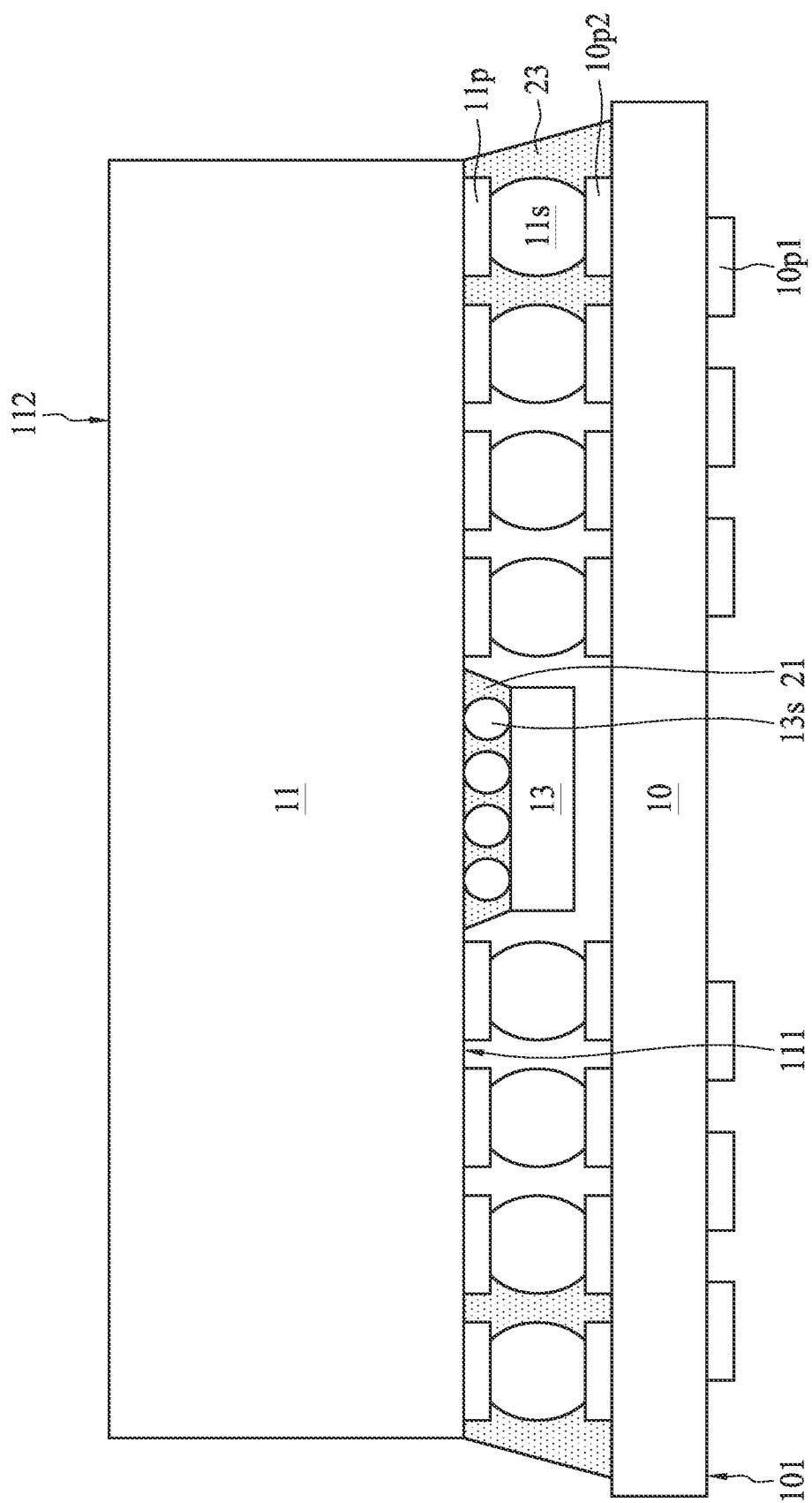
Figure 6D:
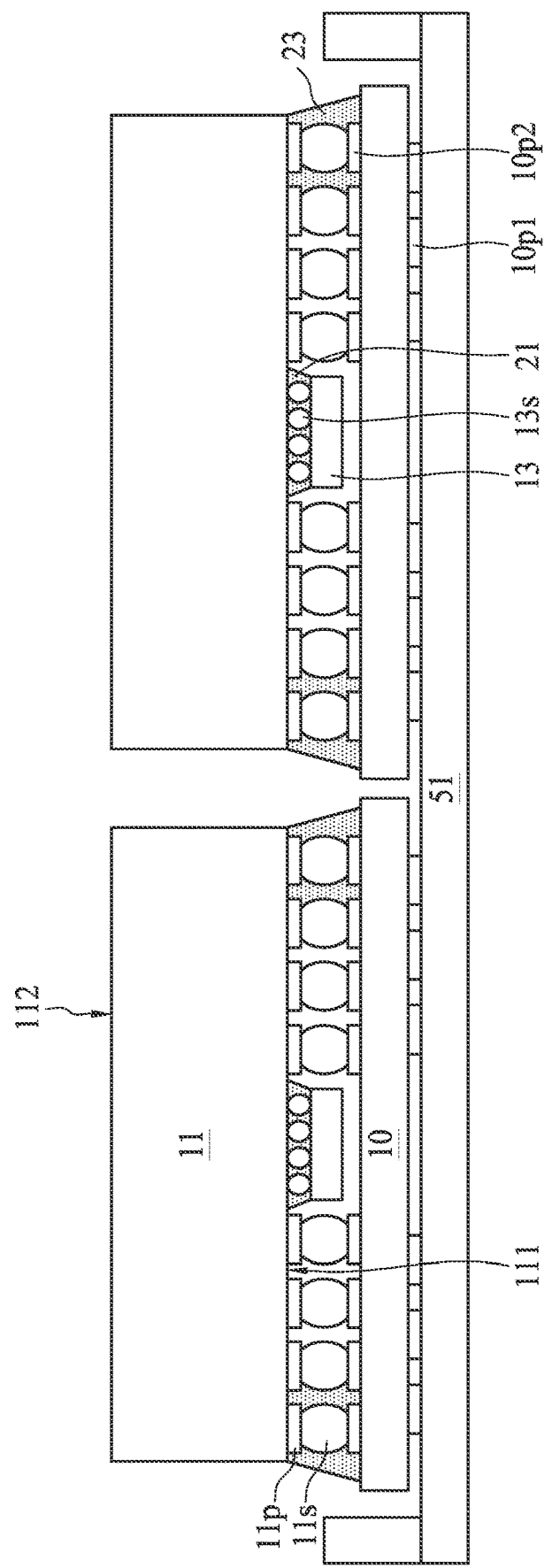

Referring to FIG. 6D, the electronic component 14 is disposed on the surface 112 of the substrate 11. In some embodiments, the electronic component 14 is thermocompression bonded. In some embodiments, the electronic component 14 is reflowed. In some embodiments, as mentioned, the encapsulant 23 may protect the electrical contact 11$s$ and improves the reliability of the electrical contact 11$s$. An encapsulant 22 is disposed to cover the electronic component 14, the electronic component 13, the encapsulant 23, and the encapsulant 21. A part of the encapsulant 22 is disposed between the substrate 11 and the substrate 10.

In some embodiments, after the operation of FIG. 6B and before the operation of FIG. 6C, the individual structure in FIG. 6B can be inspected under a test (such as an ATC test) to identify KGD of the electronic component 13 through the electrical contact 11$s$ on the substrate 11.

Alternatively, after the operation of FIG. 6C and before the operation of FIG. 6D, the structure in FIG. 6C can be inspected under a test (such as an ATC test) to identify KGD of the electronic component 13 through the electrical contact 10$p1$ on the substrate 10.

Figure 6E:
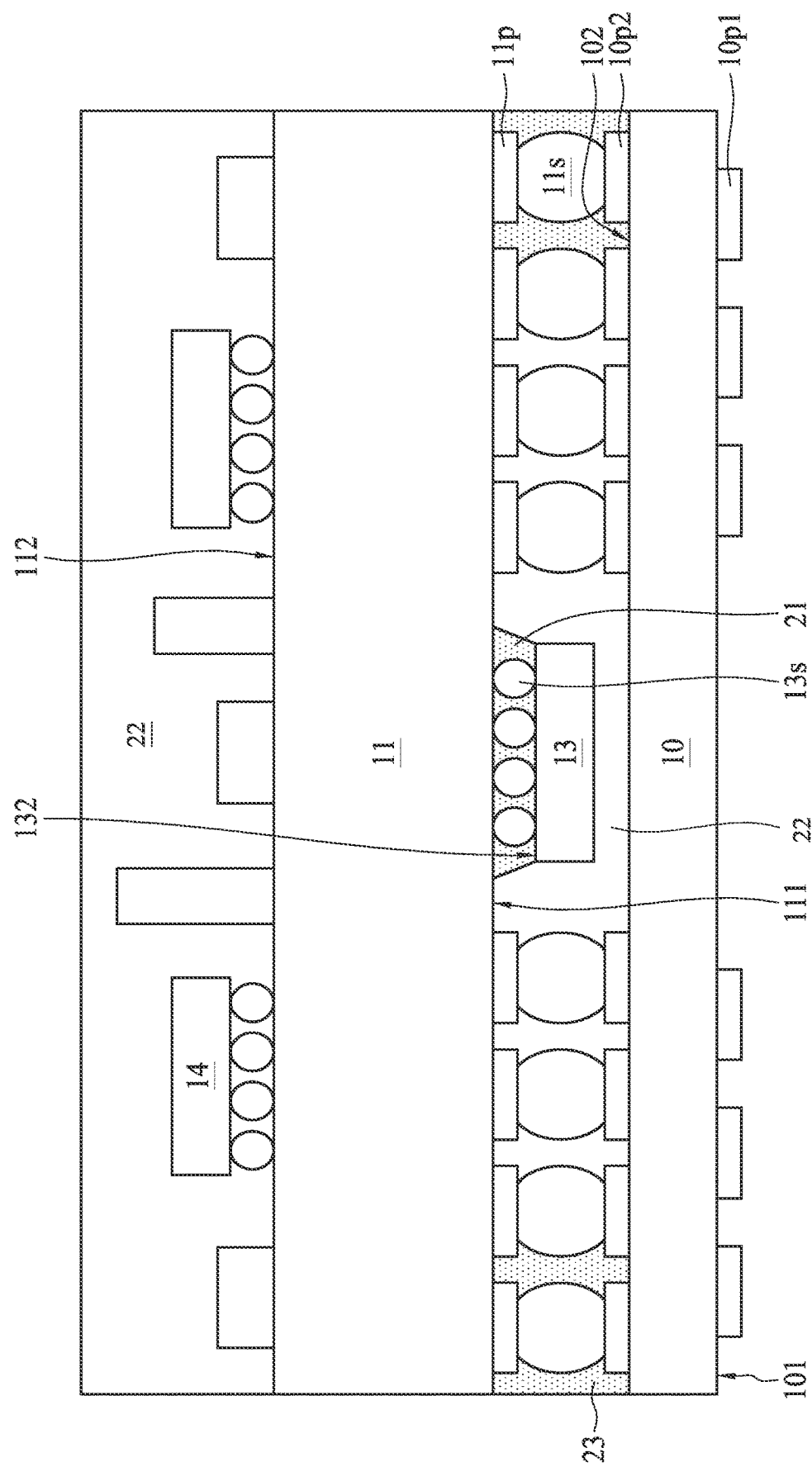
FIG. 6E illustrates one or more stages of a method of manufacturing a semiconductor device package in accordance with some embodiments of the present disclosure.
Figure 6F:
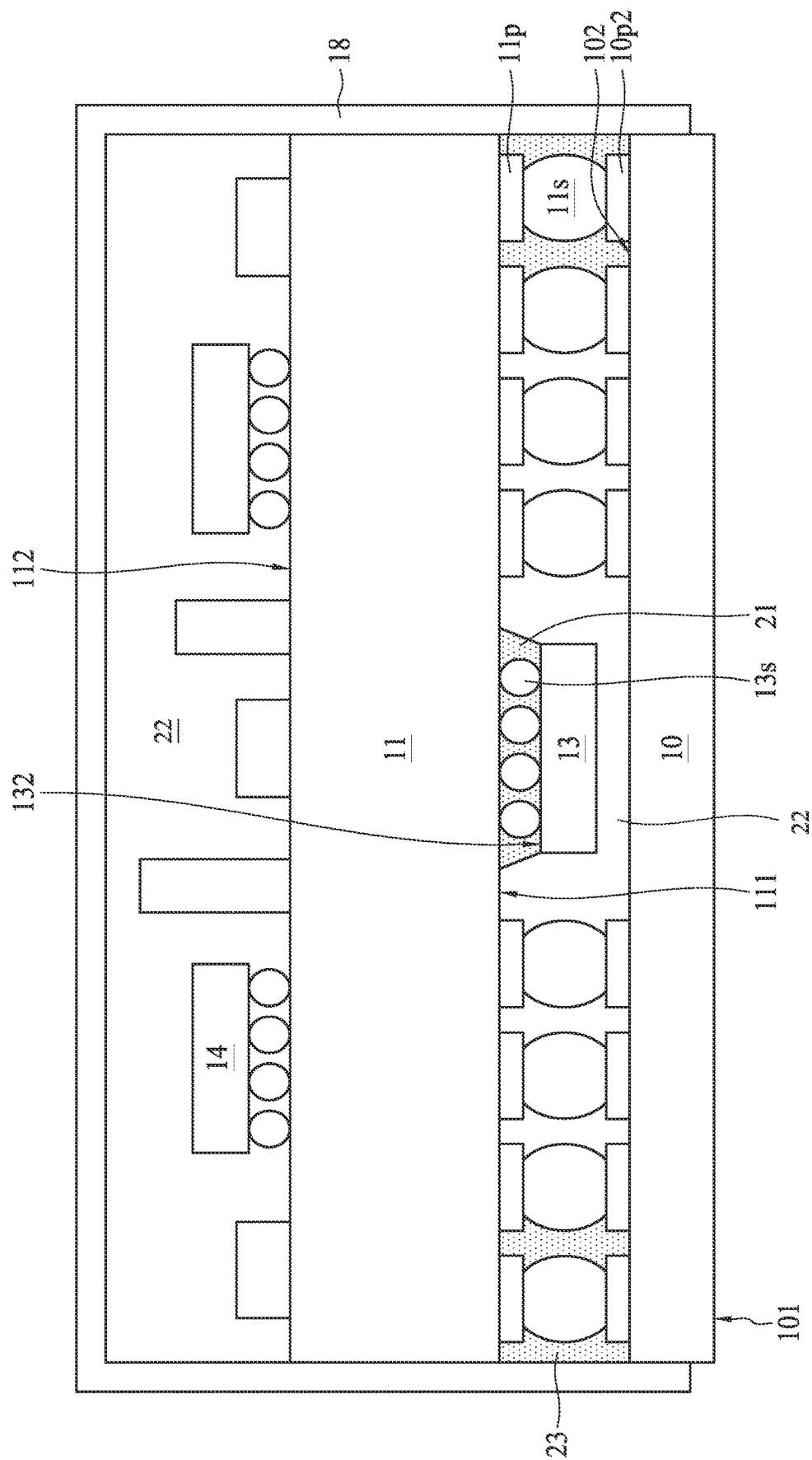
FIG. 6F illustrates one or more stages of a method of manufacturing a semiconductor device package in accordance with some embodiments of the present disclosure.
Figure 6G:
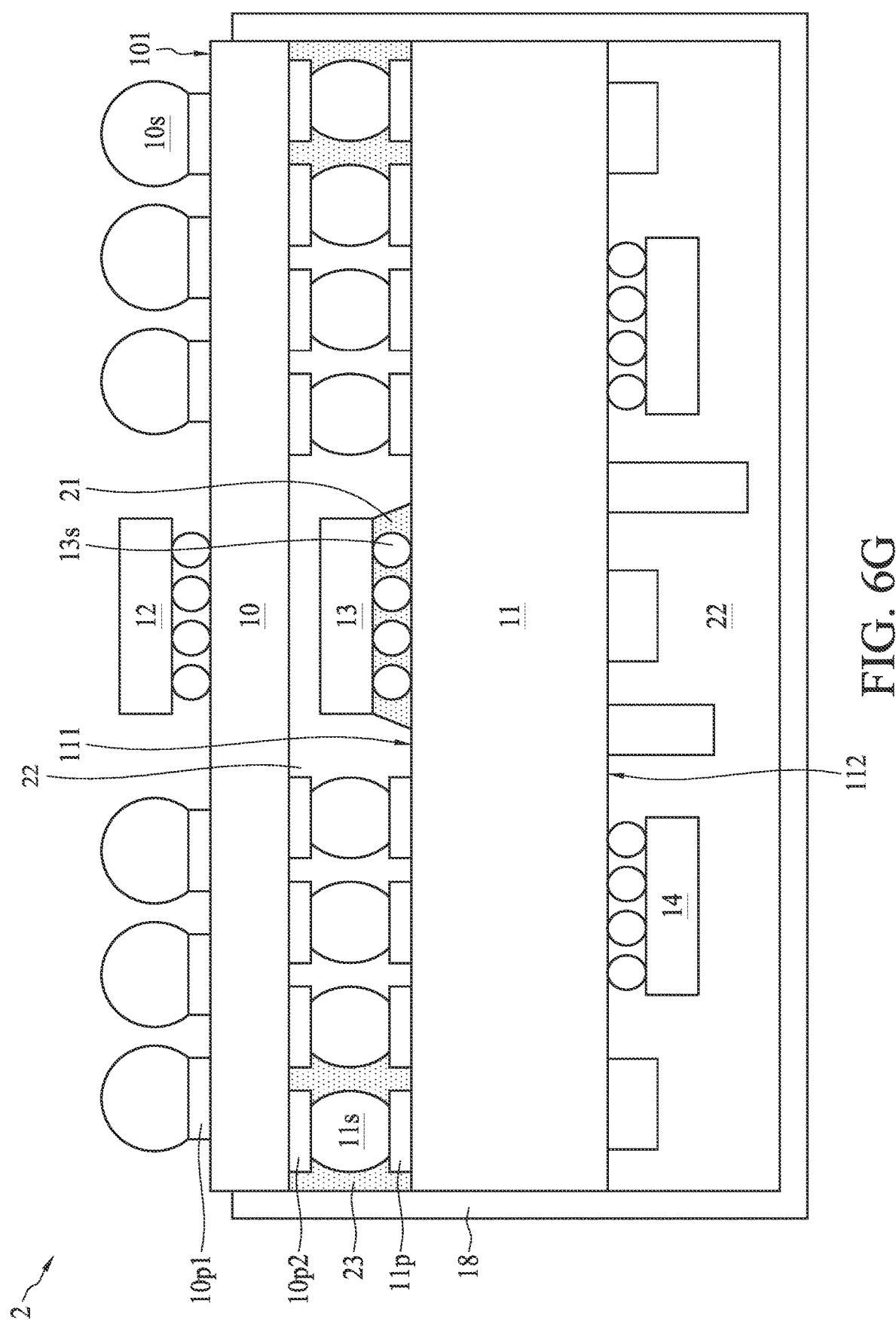
FIG. 6G illustrates one or more stages of a method of manufacturing a semiconductor device package in accordance with some embodiments of the present disclosure.

The operation of FIG. 6E is similar to the operation of FIG. 5E. The operation of FIG. 6F is similar to the operation of FIG. 5F. The operation of FIG. 6G is similar to the operation of FIG. 5G.

The final structure obtained from the operations of FIG. 6A, FIG. 6B, FIG. 6C, FIG. 6D, FIG. 6E, FIG. 6F, and FIG. 6G may be similar to the semiconductor device package 2 of FIG. 2A.

In some embodiments, the operation of FIG. 6D may be replaced with the operations of FIG. 6D', FIG. 6D", and FIG. 6D'".

FIG. 6D', FIG. 6D", and FIG. 6D'" are cross-sectional views of a semiconductor device package at various stages of fabrication, in accordance with some embodiments of the present disclosure. At least some of these figures have been simplified to better understand the aspects of the present disclosure.

The operation of FIG. 6D' is similar to the operation of FIG. 5D'. The operation of FIG. 6D" is similar to the operation of FIG. 5D". The operation of FIG. 6D'" is similar to the operation of FIG. 5D'".

In some embodiments, after the operation of FIG. 6D' and before the operation of FIG. 6D'", the individual structure in FIG. 6D' can be inspected under a test (such as an ATC test) to identify KGD of the electronic component 13 through the electrical contact 10p1 on the substrate 10.

FIG. 7A, FIG. 7B, FIG. 7C, FIG. 7D, FIG. 7E, FIG. 7F, and FIG. 7G are cross-sectional views of a semiconductor device package at various stages of fabrication, in accordance with some embodiments of the present disclosure. At least some of these figures have been simplified to better understand the aspects of the present disclosure.

Figure 7A:
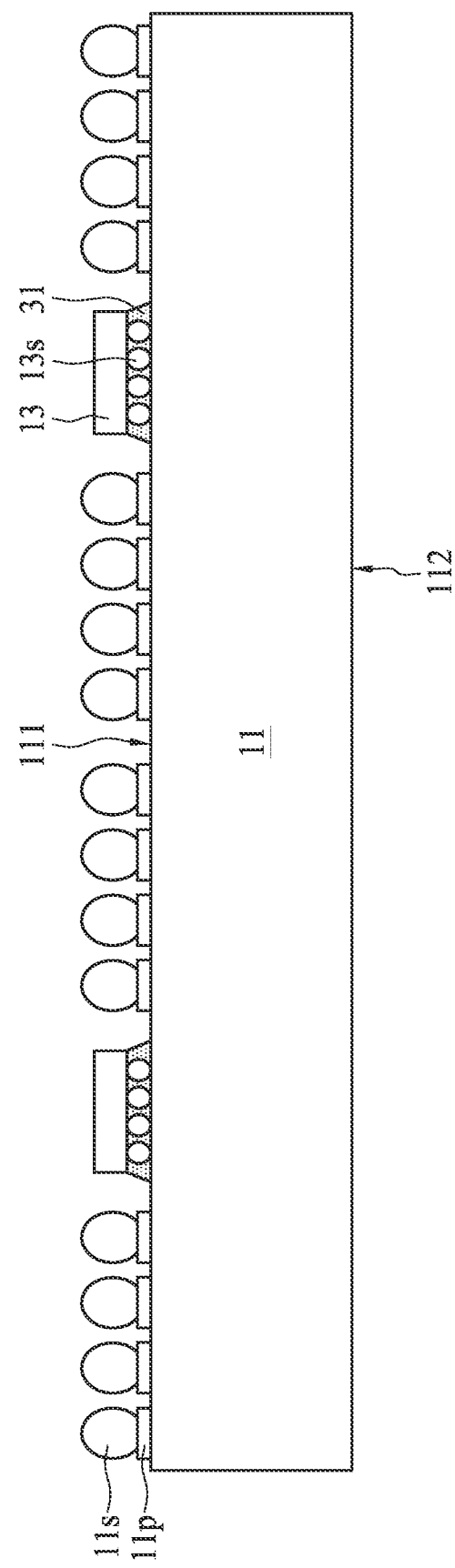
FIG. 7A illustrates one or more stages of a method of manufacturing a semiconductor device package in accordance with some embodiments of the present disclosure.

The operation of FIG. 7A is similar to the operation of FIG. 5A. The operation of FIG. 7B is similar to the operation of FIG. 5B.

Figure 7B:
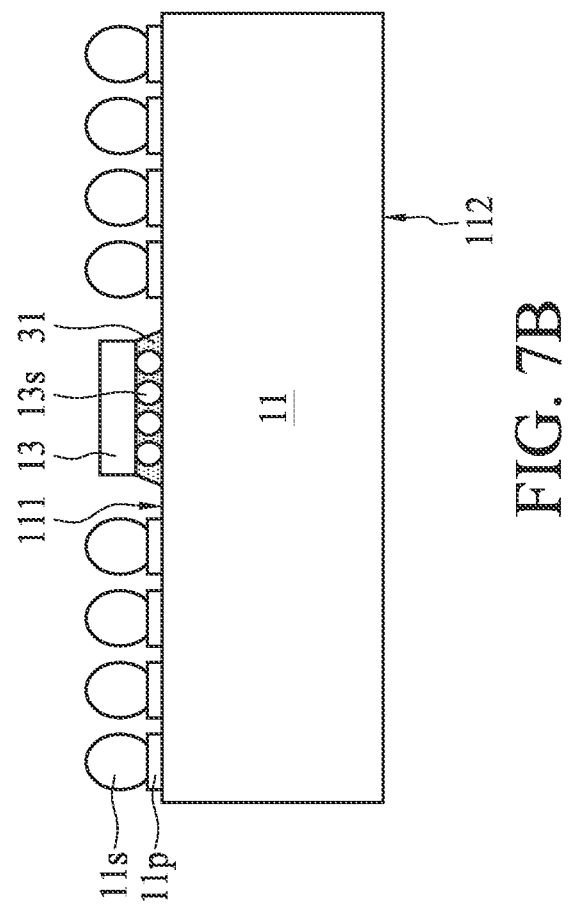
FIG. 7B illustrates one or more stages of a method of manufacturing a semiconductor device package in accordance with some embodiments of the present disclosure.
Figure 7C:
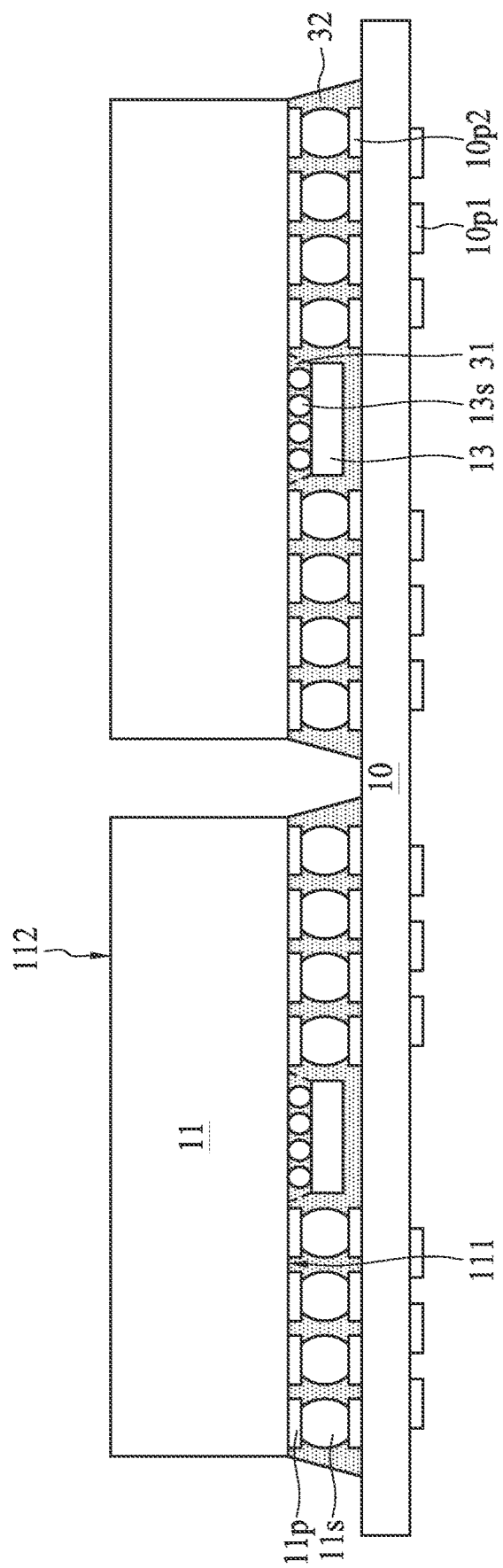
FIG. 7C illustrates one or more stages of a method of manufacturing a semiconductor device package in accordance with some embodiments of the present disclosure.

Referring to FIG. 7C, the individual structures in FIG. 7B are flipped and disposed on a substrate 10. An encapsulant 32 is disposed between the substrate 10 and the substrate 11. The lateral surface and the surface 112 of the substrate 11 may be exposed from the encapsulant 32. The encapsulant 32 surrounds the encapsulant 31 and the electrical contact 11s. The encapsulant 32 and the encapsulant 31 may have the same material. The encapsulant 32 may form an interface with the encapsulant 31.

Figure 7D:
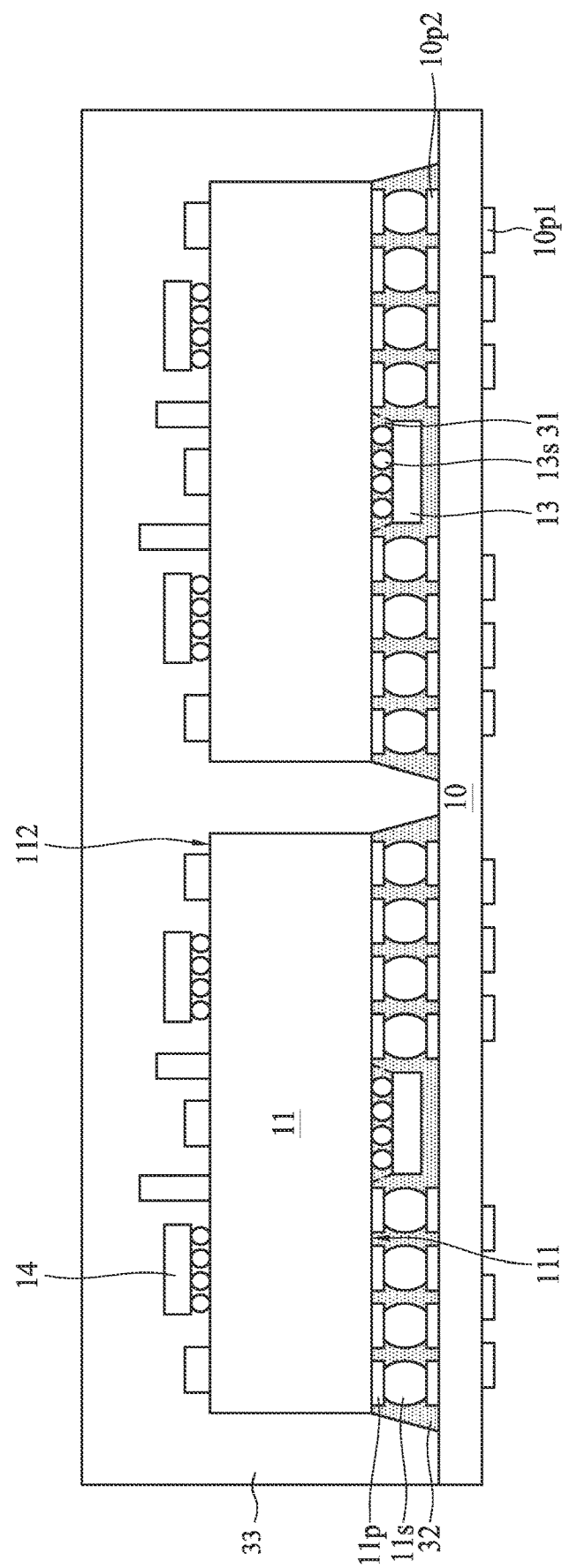
FIG. 7D illustrates one or more stages of a method of manufacturing a semiconductor device package in accordance with some embodiments of the present disclosure.
Figure 7D:
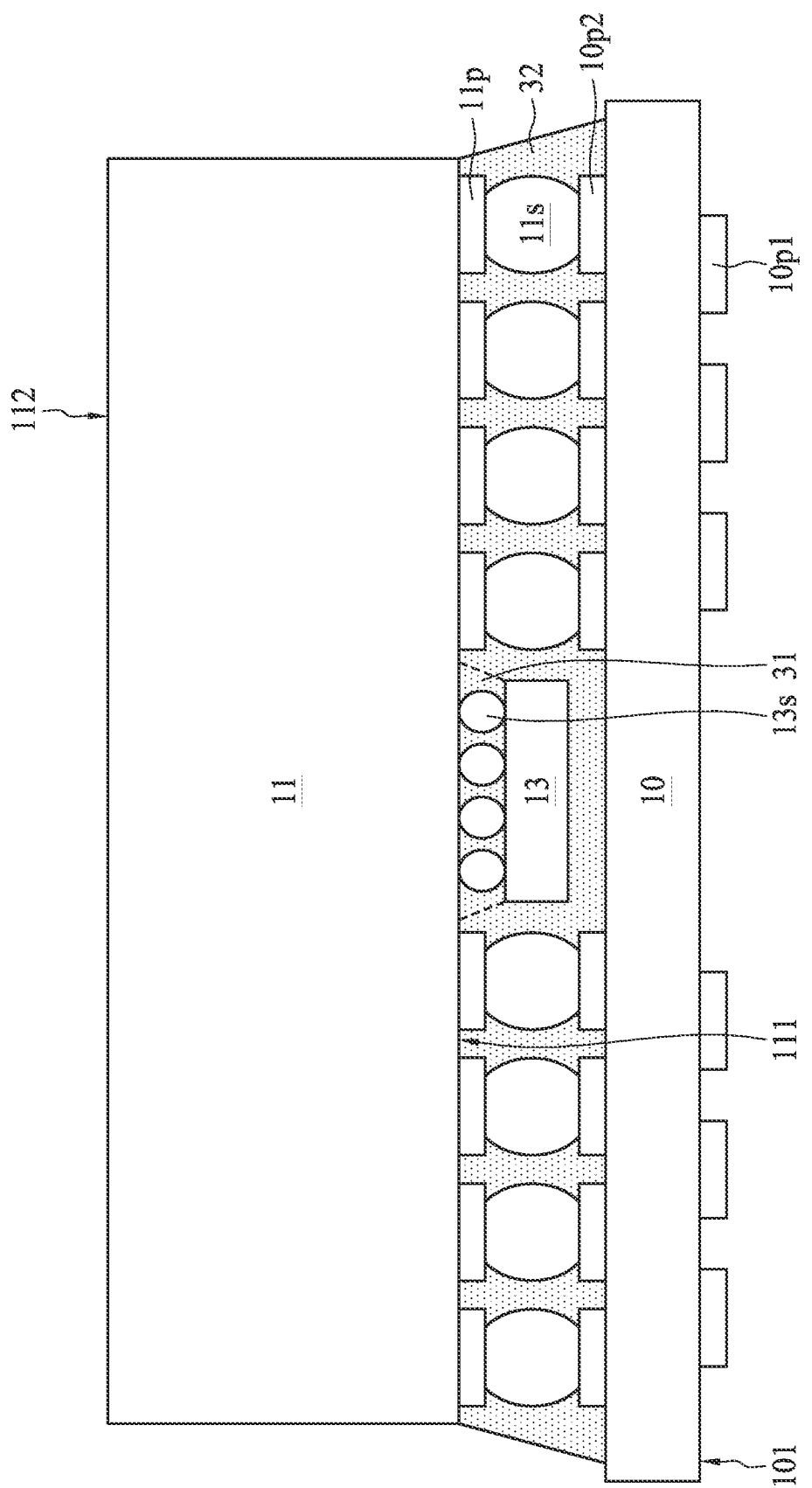
Figure 7D:
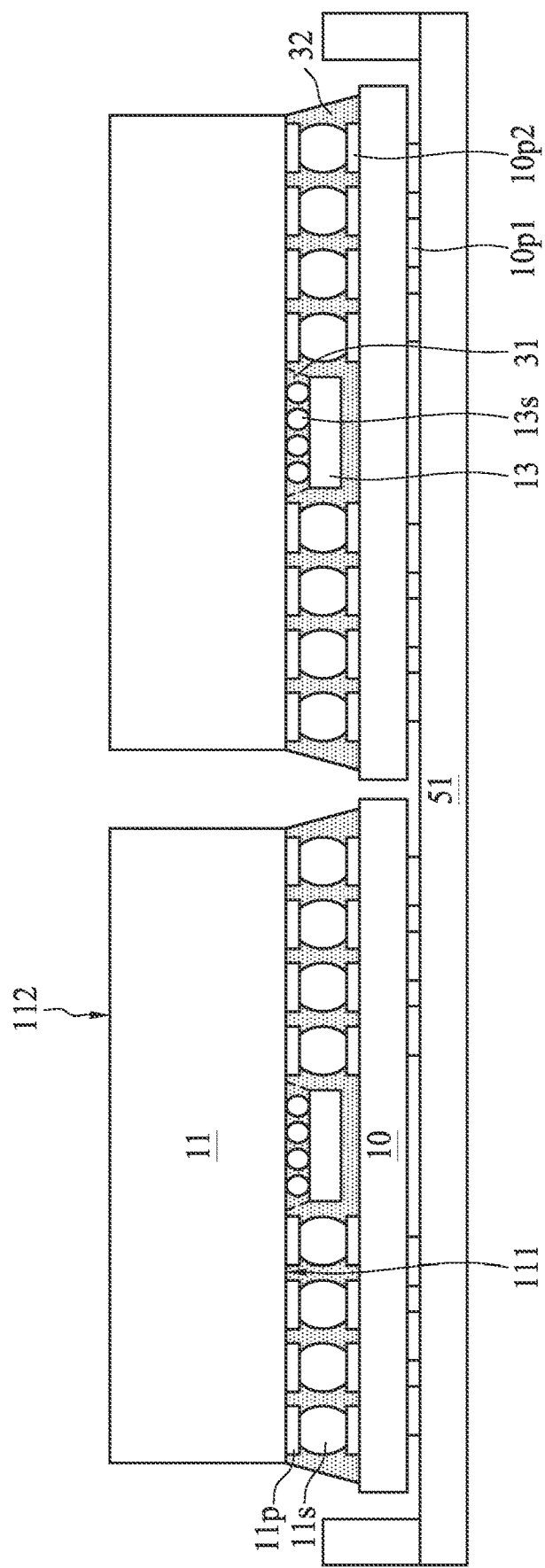
Figure 7D:
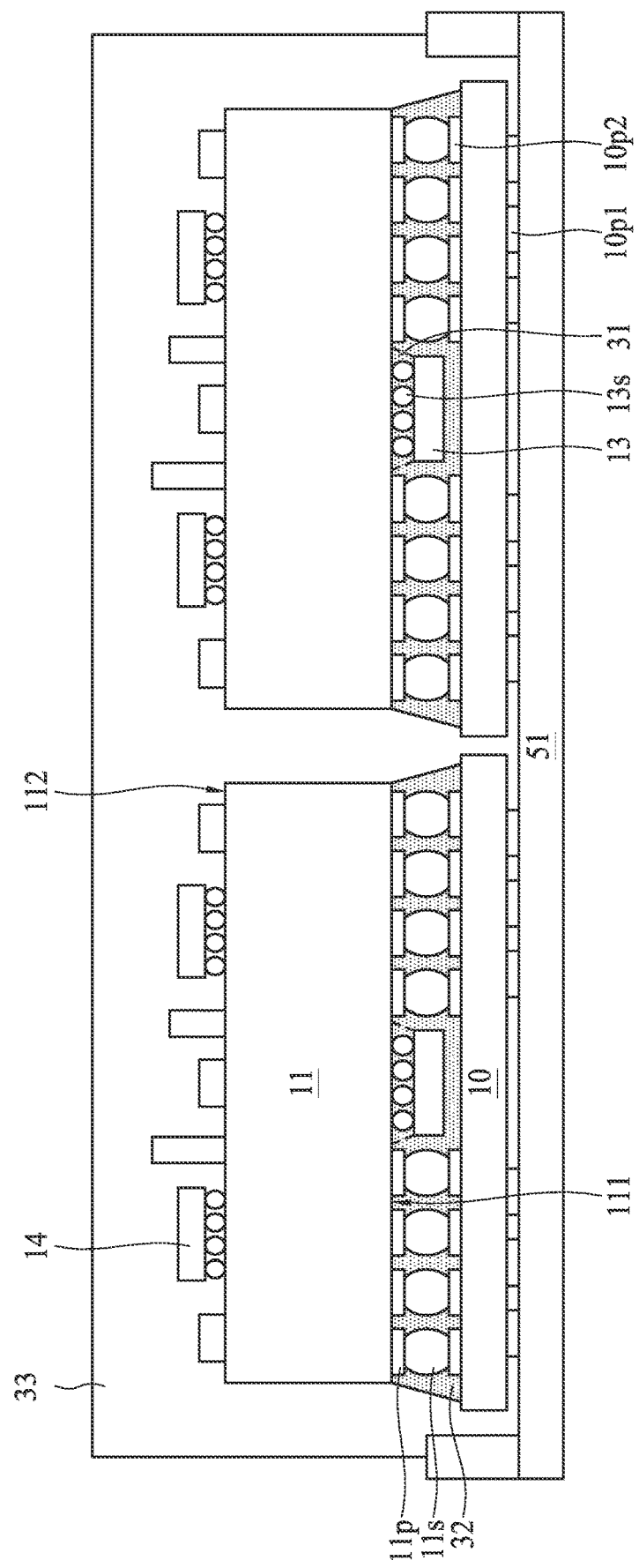

Referring to FIG. 7D, an electronic component 14 is disposed on the surface 112 of the substrate 11. In some embodiments, the electronic component 14 is thermocompression bonded. In some embodiments, the electronic component 14 is reflowed. In some embodiments, as mentioned, the encapsulant 32 may protect the electrical contact 11s and improves the reliability of the electrical contact 11s. An encapsulant 33 is disposed to cover the electronic component 14, the lateral surface of the substrate 11, and the encapsulant 32.

In some embodiments, after the operation of FIG. 7B and before the operation of FIG. 7C, the individual structure in FIG. 7B can be inspected under a test (such as an ATC test) to identify KGD of the electronic component 13 through the electrical contact 11s on the substrate 11.

Alternatively, after the operation of FIG. 7C and before the operation of FIG. 7D, the structure in FIG. 7C can be inspected under a test (such as an ATC test) to identify KGD of the electronic component 13 through the electrical contact 10p1 on the substrate 10.

Figure 7E:
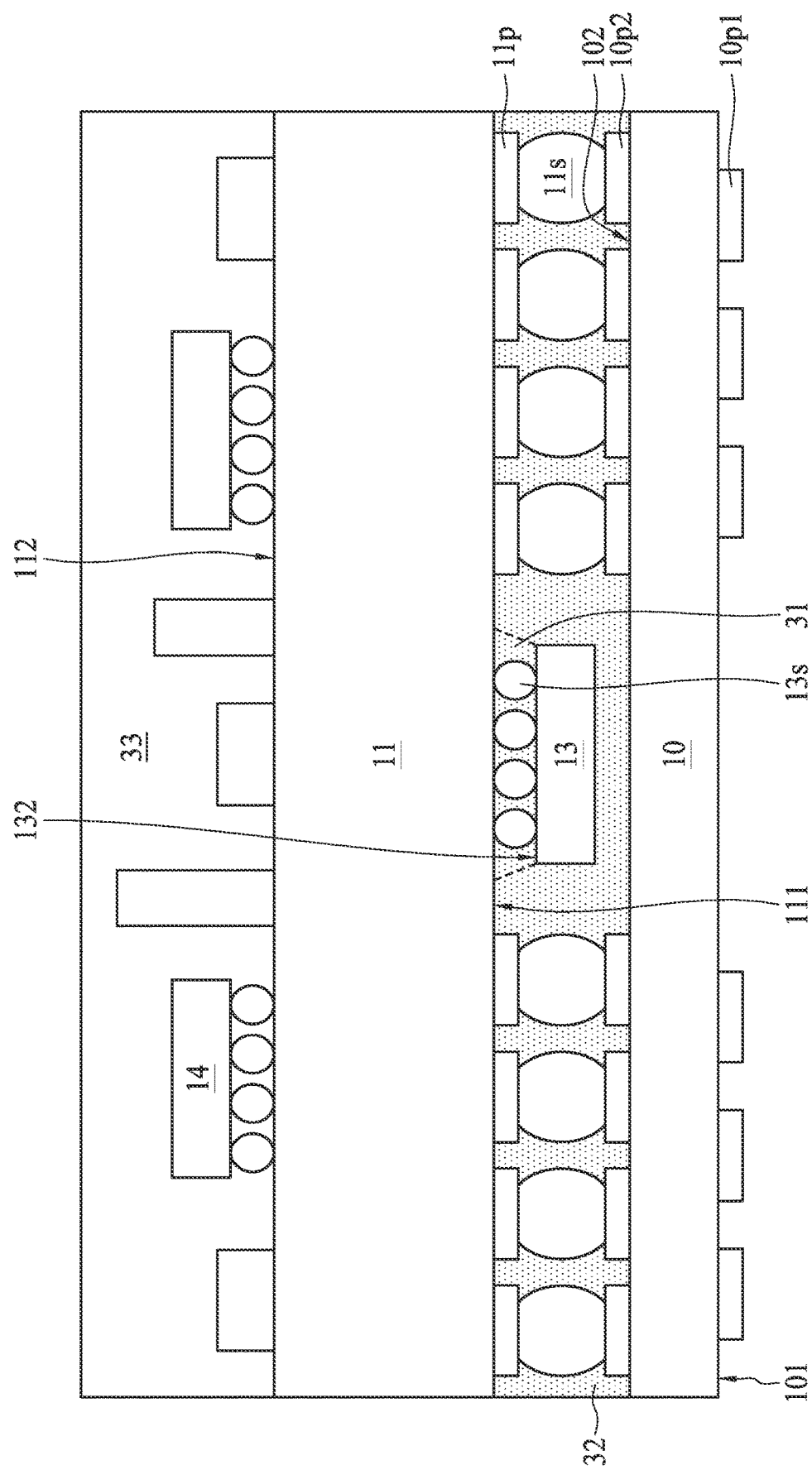
FIG. 7E illustrates one or more stages of a method of manufacturing a semiconductor device package in accordance with some embodiments of the present disclosure.
Figure 7F:
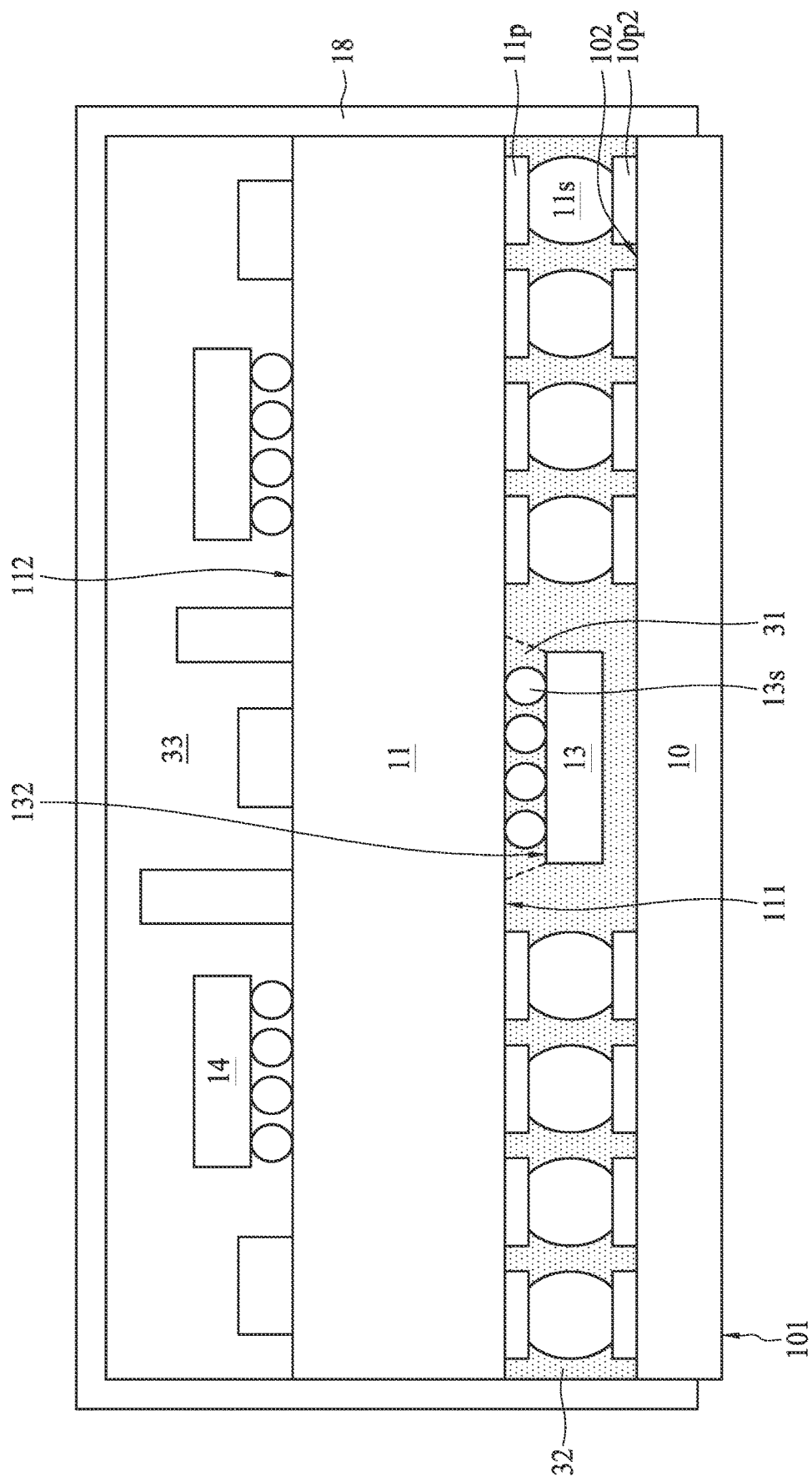
FIG. 7F illustrates one or more stages of a method of manufacturing a semiconductor device package in accordance with some embodiments of the present disclosure.
Figure 7G:
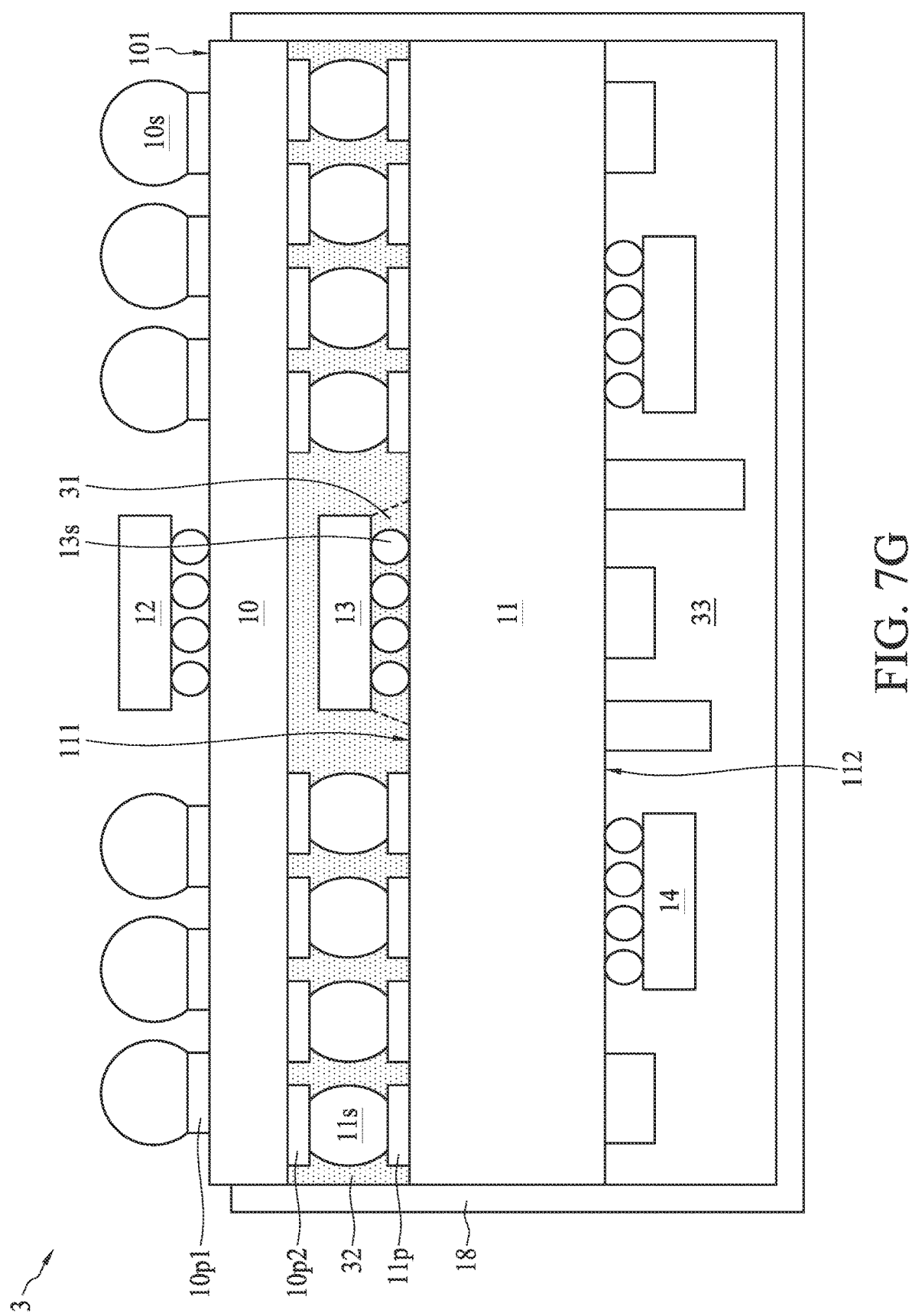
FIG. 7G illustrates one or more stages of a method of manufacturing a semiconductor device package in accordance with some embodiments of the present disclosure.

The operation of FIG. 7E is similar to the operation of FIG. 5E. The operation of FIG. 7F is similar to the operation of FIG. 5F. The operation of FIG. 7G is similar to the operation of FIG. 5G.

The final structure obtained from the operations of FIG. 7A, FIG. 7B, FIG. 7C, FIG. 7D, FIG. 7E, FIG. 7F, and FIG. 7G may be similar to the semiconductor device package 3 of FIG. 3.

In some embodiments, the operation of FIG. 7D may be replaced with the operations of FIG. 7D', FIG. 7D", and FIG. 7D'".

FIG. 7D', FIG. 7D", and FIG. 7D'" are cross-sectional views of a semiconductor device package at various stages of fabrication, in accordance with some embodiments of the present disclosure. At least some of these figures have been simplified to better understand the aspects of the present disclosure.

The operation of FIG. 7D' is similar to the operation of FIG. 5D'. The operation of FIG. 7D" is similar to the operation of FIG. 5D". The operation of FIG. 7D'" is similar to the operation of FIG. 5D'".

In some embodiments, after the operation of FIG. 7D' and before the operation of FIG. 7D'", the individual structure in FIG. 7D' can be inspected under a test (such as an ATC test) to identify KGD of the electronic component 13 through the electrical contact 10p1 on the substrate 10.

FIG. 8A, FIG. 8B, FIG. 8C, FIG. 8D, FIG. 8E, FIG. 8F, and FIG. 8G are cross-sectional views of a semiconductor device package at various stages of fabrication, in accordance with some embodiments of the present disclosure. At least some of these figures have been simplified to better understand the aspects of the present disclosure.

Figure 8A:
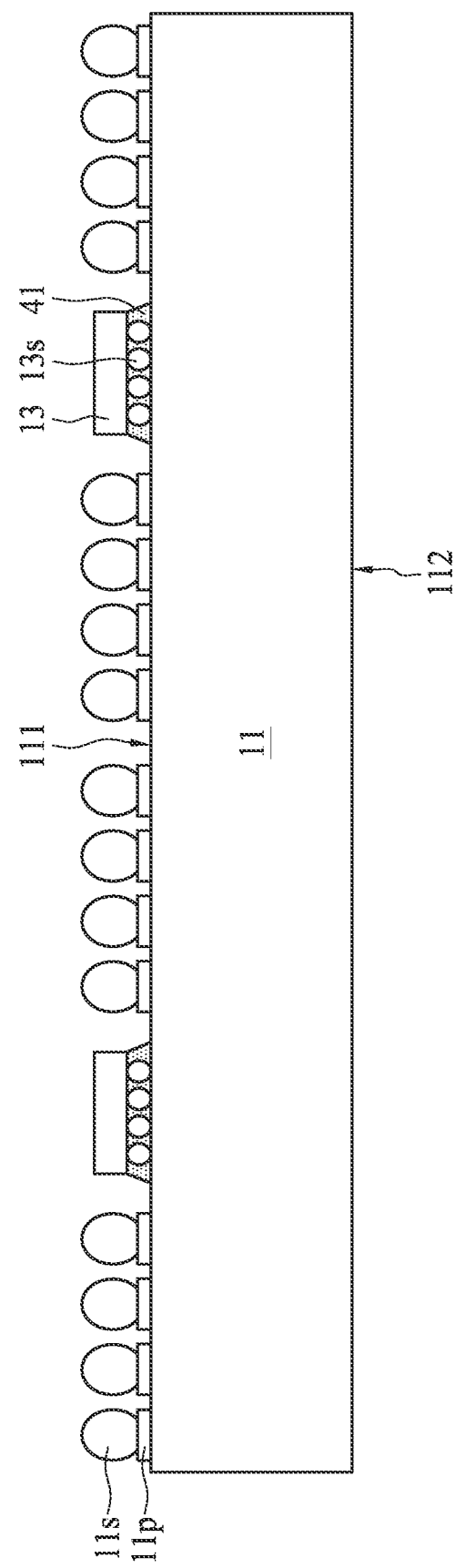
FIG. 8A illustrates one or more stages of a method of manufacturing a semiconductor device package in accordance with some embodiments of the present disclosure.

The operation of FIG. 8A is similar to the operation of FIG. 5A. The operation of FIG. 8B is similar to the operation of FIG. 5B.

Figure 8B:
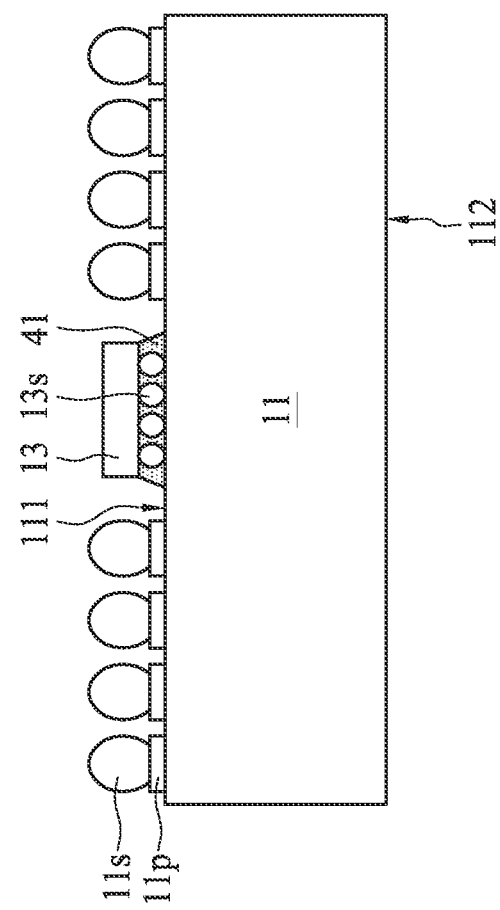
FIG. 8B illustrates one or more stages of a method of manufacturing a semiconductor device package in accordance with some embodiments of the present disclosure.
Figure 8C:
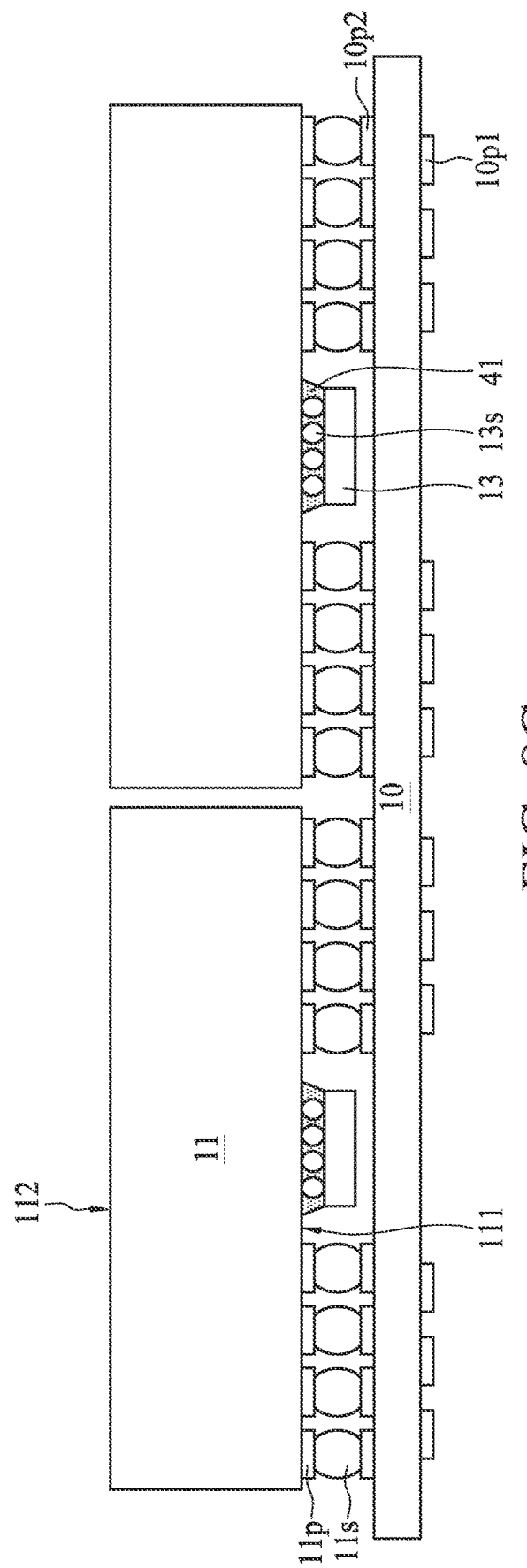
FIG. 8C illustrates one or more stages of a method of manufacturing a semiconductor device package in accordance with some embodiments of the present disclosure.

Referring to FIG. 8C, the individual structures in FIG. 8B are flipped and disposed on a substrate 10.

Figure 8D:
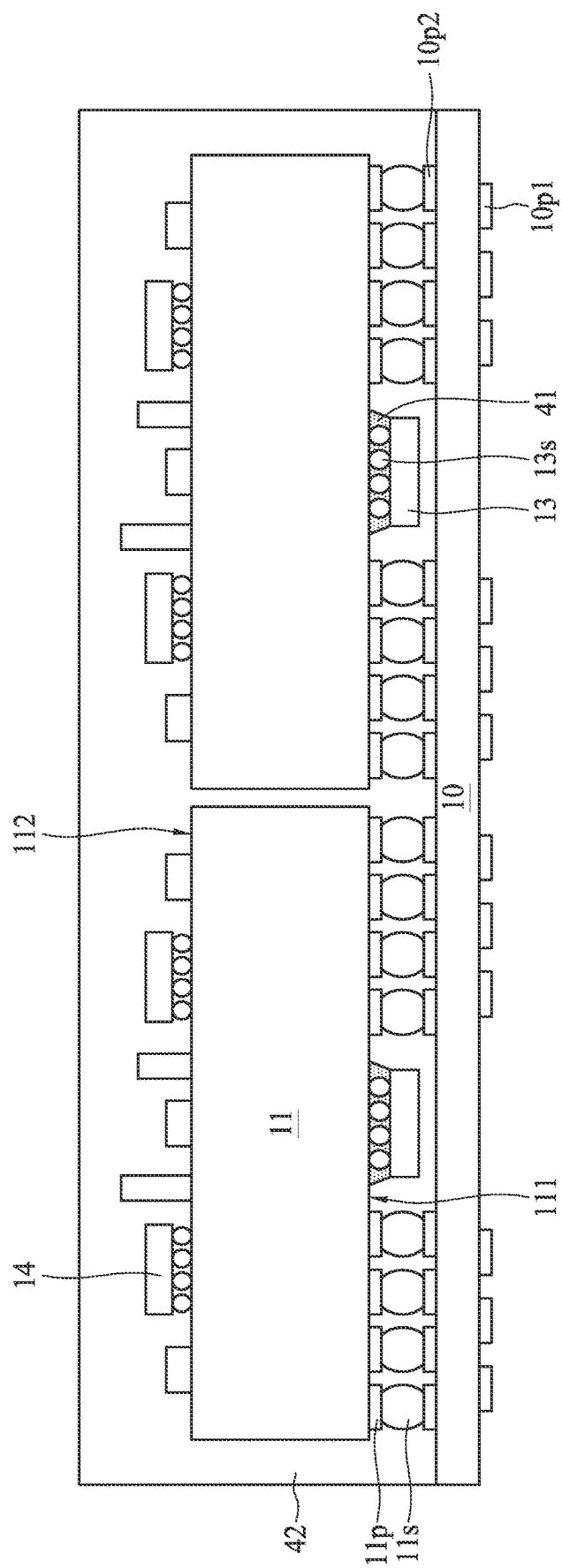
FIG. 8D illustrates one or more stages of a method of manufacturing a semiconductor device package in accordance with some embodiments of the present disclosure.

Referring to FIG. 8D, an electronic component 14 is disposed on the surface 112 of the substrate 11. In some embodiments, the electronic component 14 is thermocompression bonded. In some embodiments, the electronic component 14 is reflowed. An encapsulant 42 is disposed to cover the electronic component 14, the lateral surface of the substrate 11, the electrical contact 11s, the encapsulant 41, and the electronic component 13. The electronic component 14 and the electronic component 13 are molded in the same operation. In some embodiments, the electrical contact 11s in FIG. 8C may be more than the electrical contact 11s in FIGS. 5C, 6C, and 7C, so as to bear the reflow operation.

In some embodiments, after the operation of FIG. 8B and before the operation of FIG. 8C, the individual structure in FIG. 8B can be inspected under a test (such as an ATC test) to identify KGD of the electronic component 13 through the electrical contact 11s on the substrate 11.

Figure 8E:
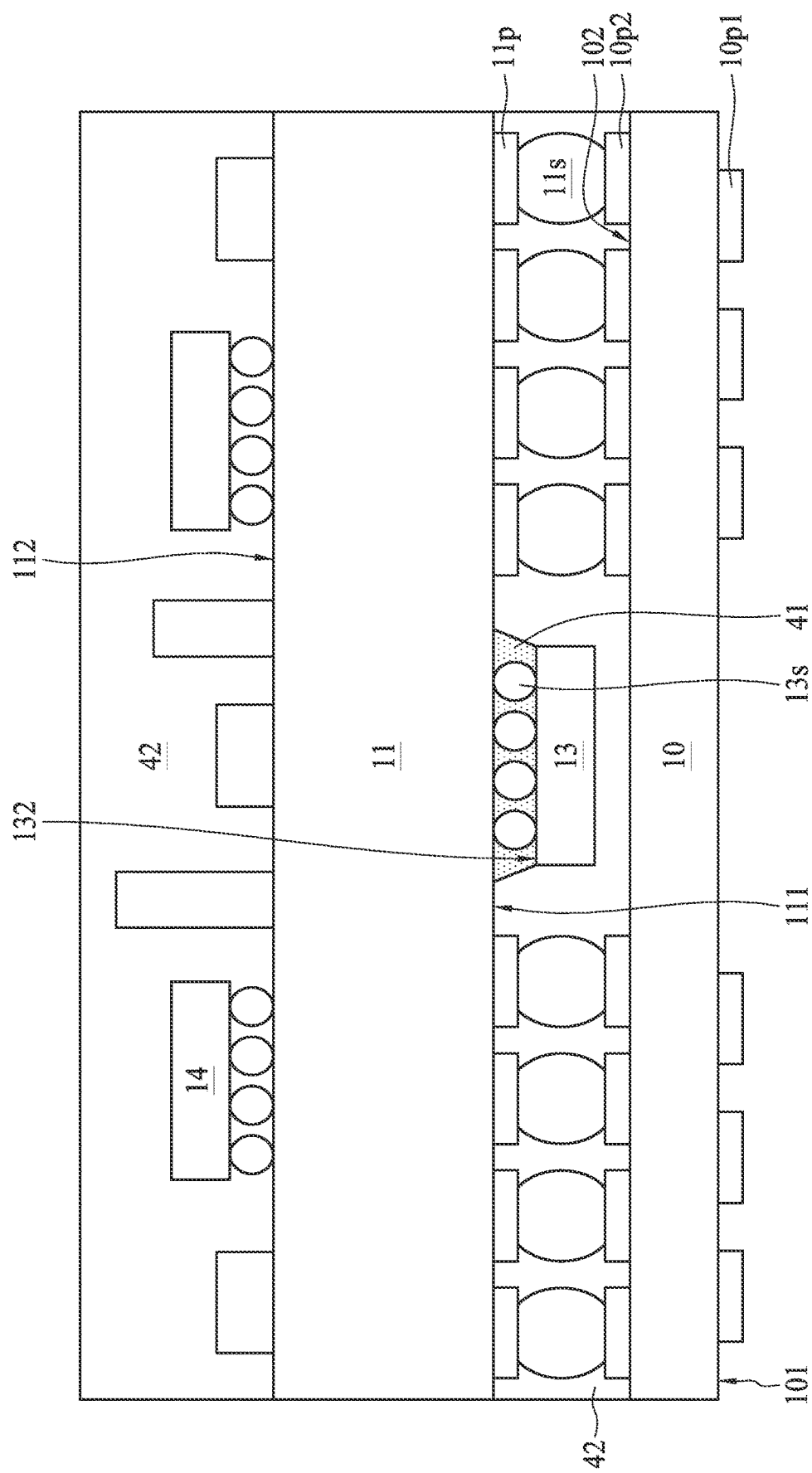
FIG. 8E illustrates one or more stages of a method of manufacturing a semiconductor device package in accordance with some embodiments of the present disclosure.
Figure 8F:
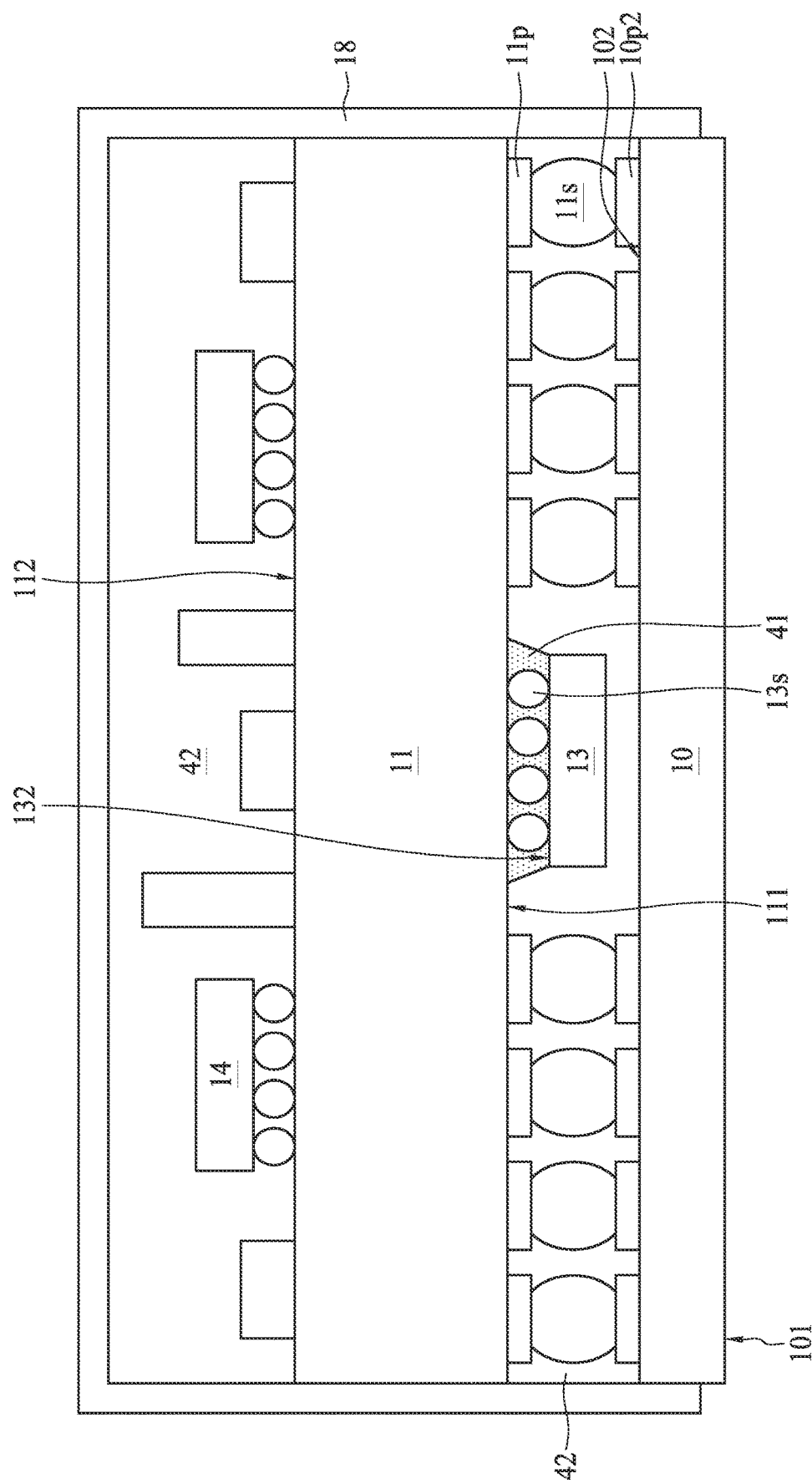
FIG. 8F illustrates one or more stages of a method of manufacturing a semiconductor device package in accordance with some embodiments of the present disclosure.
Figure 8G:
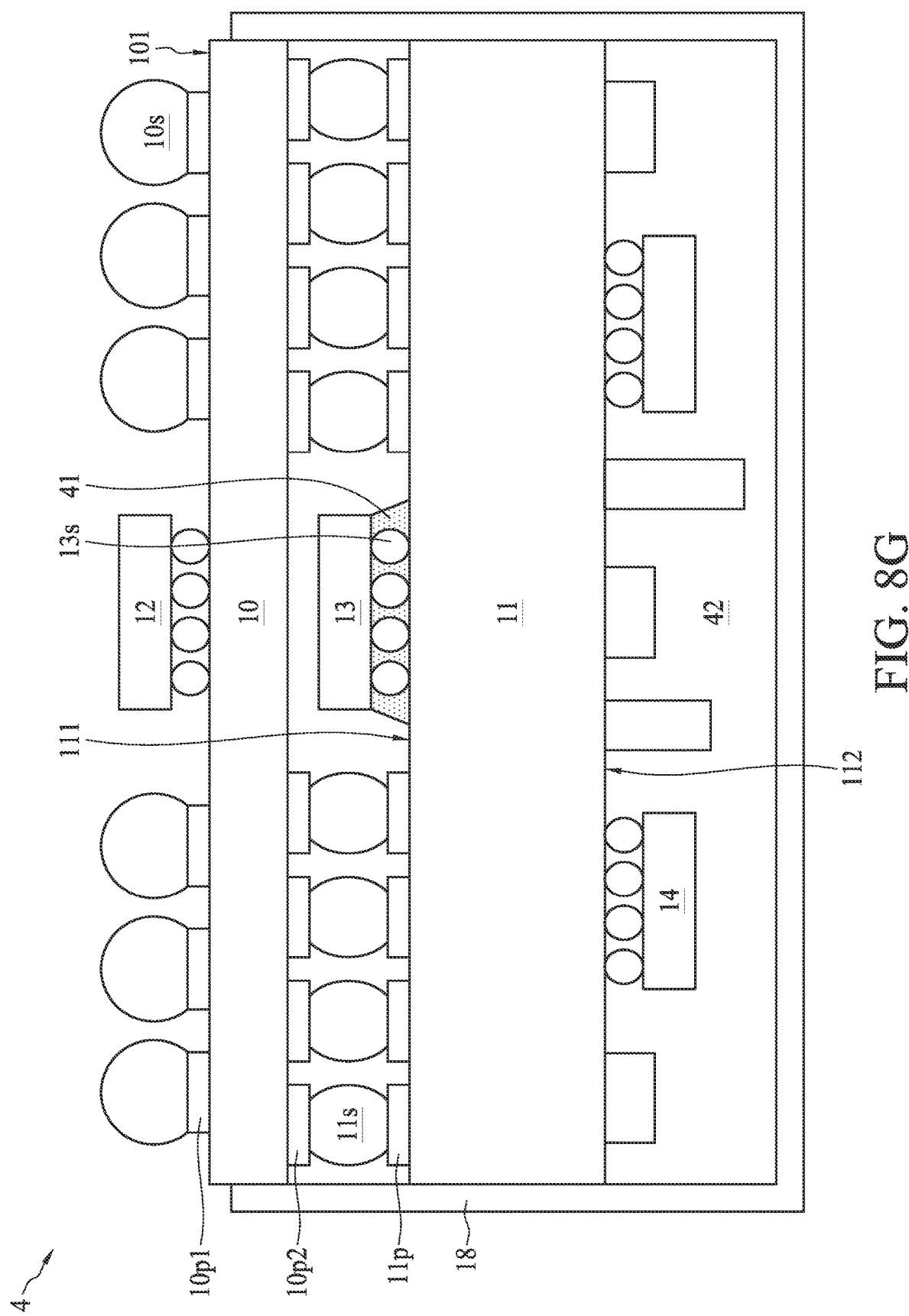
FIG. 8G illustrates one or more stages of a method of manufacturing a semiconductor device package in accordance with some embodiments of the present disclosure.

The operation of FIG. 8E is similar to the operation of FIG. 5E. The operation of FIG. 8F is similar to the operation of FIG. 5F. The operation of FIG. 8G is similar to the operation of FIG. 5G.

The final structure obtained from the operations of FIG. 8A, FIG. 8B, FIG. 8C, FIG. 8D, FIG. 8E, FIG. 8F, and FIG. 8G may be similar to the semiconductor device package 4 of FIG. 4.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial," and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a first substrate;
a second substrate disposed over the first substrate;
a first encapsulant connecting the first substrate to the second substrate; and
a second encapsulant disposed between the first substrate and the second substrate, and configured to support the second substrate to prevent the second substrate from tilting with respect to the first substrate under a reflow process;
wherein the second encapsulant is disposed on a periphery region of the first substrate; and
wherein the second encapsulant comprises a plurality of portions spaced apart from one another.

2. The semiconductor device package of claim 1, wherein the plurality of portions of the second encapsulant are disposed on corners of the first substrate.

3. The semiconductor device package of claim 1, wherein each of the plurality of portions of the second encapsulant encapsulates at least one connector.

4. A semiconductor device package, comprising:
a first substrate;
a second substrate disposed over the first substrate;
a first encapsulant connecting the first substrate to the second substrate; and
a second encapsulant disposed between the first substrate and the second substrate, and configured to support the second substrate to prevent the second substrate from tilting with respect to the first substrate under a reflow process;
wherein the second encapsulant is spaced apart from a connector connecting the first substrate to the second substrate.

5. The semiconductor device package of claim 4, wherein the second encapsulant comprises a first elongate section and a second elongate section angled with the first elongate section from a top view.

6. The semiconductor device package of claim 5, wherein the first elongate section and the second elongate section are substantially perpendicular to each other.

7. The semiconductor device package of claim 4, wherein an interface is formed between the first encapsulant and the second encapsulant.

8. The semiconductor device package of claim 7, wherein the interface is formed between two adjacent connectors.

9. A semiconductor device package, comprising:
a first substrate;
a second substrate disposed over the first substrate;
a first encapsulant connecting the first substrate to the second substrate; and
a second encapsulant disposed between the first substrate and the second substrate, and configured to support the second substrate to prevent the second substrate from tilting with respect to the first substrate under a reflow process;
wherein the second encapsulant comprises a curved edge extending from a first edge of the first encapsulant to a second edge of the first encapsulant from a top view.

10. A semiconductor device package, comprising:
a first substrate;
a second substrate disposed over the first substrate;
an electronic component disposed between the first substrate and the second substrate;
a first encapsulant connecting the electronic component to the second substrate;
a second encapsulant connecting the first substrate to the second substrate, wherein the first encapsulant and the second encapsulant comprise a same material; and
a third encapsulant covering a top surface of the second substrate, wherein the third encapsulant comprises a first material and the second encapsulant comprise a second material different from the first material.

11. The semiconductor device package of claim 10, wherein the third encapsulant and the second encapsulant include fillers having non-overlapping ranges of sizes.

12. The semiconductor device package of claim 10, wherein a thickness of the second substrate is greater than a thickness of the first substrate.

13. The semiconductor device package of claim 10, wherein an interface is formed between the first encapsulant and the second encapsulant.

14. A semiconductor device package, comprising:
a first substrate;
a second substrate disposed over the first substrate;
an electronic component disposed between the first substrate and the second substrate;
a first encapsulant connecting the electronic component to the second substrate;
a second encapsulant connecting the first substrate to the second substrate, wherein the first encapsulant and the second encapsulant comprise a same material;
a plurality of first connectors connecting between the first substrate and the second substrate; and
a plurality of second connectors disposed under a bottom surface of the first substrate, wherein at least one of the plurality of second connectors has a diameter greater than a diameter of at least one of the plurality of first connectors.

15. A semiconductor device package, comprising:
   a first substrate;
   a second substrate disposed over the first substrate;
   an electronic component disposed between the first substrate and the second substrate;
   a first encapsulant connecting the electronic component to the second substrate; a second encapsulant connecting the first substrate to the second substrate, wherein the first encapsulant and the second encapsulant comprise a same material;
   a plurality of first connectors connecting between the first substrate and the second substrate; and
   a plurality of second connectors disposed under a bottom surface of the first substrate, wherein a pitch of the plurality of first connectors is less than a pitch of the plurality of second connectors.

* * * * *